(12) United States Patent
Choi

(10) Patent No.: US 11,631,831 B2
(45) Date of Patent: Apr. 18, 2023

(54) DISPLAY DEVICE

(71) Applicant: SAMSUNG DISPLAY CO., LTD., Yongin-si (KR)

(72) Inventor: Taehyeok Choi, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 201 days.

(21) Appl. No.: 17/060,367

(22) Filed: Oct. 1, 2020

(65) Prior Publication Data

US 2021/0210725 A1    Jul. 8, 2021

(30) Foreign Application Priority Data

Jan. 2, 2020  (KR) ........................ 10-2020-0000488

(51) Int. Cl.
*H01L 51/52* (2006.01)
*H01L 27/32* (2006.01)
*H01L 51/56* (2006.01)

(52) U.S. Cl.
CPC ...... *H01L 51/5253* (2013.01); *H01L 27/3246* (2013.01); *H01L 27/3258* (2013.01); *H01L 27/3276* (2013.01); *H01L 51/56* (2013.01); *H01L 27/323* (2013.01); *H01L 51/5275* (2013.01); *H01L 2227/323* (2013.01)

(58) Field of Classification Search
CPC ....... H01L 51/5253–5256; H01L 51/56; H01L 51/5275; H01L 27/3246; H01L 27/3258; H01L 27/3276; H01L 27/323; H01L 2227/323
See application file for complete search history.

(56) References Cited

U.S. PATENT DOCUMENTS

| 9,496,295 | B2 | 11/2016 | Sugitani et al. | |
|---|---|---|---|---|
| 9,741,563 | B2 | 8/2017 | Xiang et al. | |
| 11,456,437 | B2* | 9/2022 | Kim | H01L 27/3244 |
| 2019/0081273 | A1* | 3/2019 | Sung | H01L 51/52 |
| 2019/0355930 | A1* | 11/2019 | Lee | H01L 51/5256 |
| 2020/0194721 | A1* | 6/2020 | Lee | G06F 3/0412 |
| 2020/0212140 | A1* | 7/2020 | Huh | H01L 27/3258 |
| 2021/0376293 | A1* | 12/2021 | Zhao | H01L 27/3246 |

FOREIGN PATENT DOCUMENTS

| KR | 1020140081542 A | 7/2014 |
|---|---|---|
| KR | 1020150083690 A | 7/2015 |
| KR | 1020190029830 A | 3/2019 |

* cited by examiner

*Primary Examiner* — Shaun M Campbell
(74) *Attorney, Agent, or Firm* — Cantor Colburn LLP

(57) ABSTRACT

A display device includes a transmission area in a display area and includes a groove in a non-display area surrounding the transmission area and may minimize the occurrence of defective pixels because a groove forming process includes a process of forming a protection layer covering an emission area before formation of a mask layer and a process of removing the protection layer after removal of the mask layer.

19 Claims, 31 Drawing Sheets

DISPLAY DEVICE

This application claims priority to Korean Patent Application No. 10-2020-0000488, filed on Jan. 2, 2020, and all the benefits accruing therefrom under 35 U.S.C. § 119, the content of which in its entirety is herein incorporated by reference.

BACKGROUND

1. Field

One or more embodiments relate to a display device including a transmission area inside a display area.

2. Description of Related Art

Recently, display devices have been used for various purposes. Also, as display devices have become thinner and lighter, such display device are more widely used in various fields.

As an area occupied by a display area in a display device has been expanded, various combined or associated functions have been added in the display device. As a scheme for adding various functions while expanding the area, research has been conducted into a display device in which various components may be arranged in a display area.

SUMMARY

One or more embodiments include a display panel including a transmission area in which various types of components may be arranged in a display area, and a display device including the display panel.

According to an embodiment, a method of manufacturing a display device includes preparing a substrate including a transmission area, a display area surrounding the transmission area, and a non-display area between the transmission area and the display area, providing a plurality of insulating layers on the substrate and forming an opening through some of the plurality of insulating layers corresponding to the non-display area, providing a pixel electrode on the plurality of insulating layers corresponding to the display area, providing a protection layer covering the pixel electrode, providing a mask layer covering the protection layer and a side surface and a bottom surface of the opening, removing a portion of the mask layer located on the bottom surface of the opening, forming a groove by removing a lower layer of the opening after the removing the portion of the mask layer on the bottom surface thereof, removing the mask layer, removing the protection layer, and providing an intermediate layer on the pixel electrode, where the intermediate layer includes an organic material layer, and the organic material layer extends to the non-display area and is disconnected by the groove.

In an embodiment, the protection layer may cover at least an area of the pixel electrode where an emission layer is arranged.

In an embodiment, the protection layer may include an organic material.

In an embodiment, the protection layer may include a photoresist.

In an embodiment, the protection layer may include an organic ink.

In an embodiment, the protection layer may be removed by a strip process.

In an embodiment, the mask layer may include a conductive oxide.

In an embodiment, the portion of the mask layer located on the bottom surface of the opening may be removed by a wet etching process.

In an embodiment, the mask layer may be removed by a wet etching process.

In an embodiment, the lower layer of the opening may be removed by a dry etching process.

In an embodiment, the substrate may include a first base layer, a first barrier layer on the first base layer, a second base layer on the first barrier layer, and a second barrier layer on the second base layer.

In an embodiment, the lower layer of the opening may include the second base layer and the second barrier layer.

In an embodiment, the lower layer of the opening may include an inorganic layer and an organic layer located under the inorganic layer.

According to another embodiment, a display device includes a substrate including a transmission area, a display area surrounding the transmission area, and a non-display area between the transmission area and the display area, a plurality of insulating layers disposed on the substrate, a display element disposed on the plurality of insulating layers corresponding to the display area and including a pixel electrode, an opposite electrode, and an intermediate layer between the pixel electrode and the opposite electrode, a pixel definition layer covering an edge of the pixel electrode, where an opening is defined through the pixel definition layer to correspond to a portion of the pixel electrode, an organic material disposed on an inner surface of the opening of the pixel definition layer, and a groove in the non-display area. In such an embodiment, the intermediate layer includes an organic material layer, and the organic material layer extends to the non-display area is disconnected by the groove, and the groove is defined in a multiple layer including a lower layer and an upper layer and at least one selected from the lower layer and the upper layer is defined by at least one of layers constituting the substrate.

In an embodiment, the organic material may include a photoresist.

In an embodiment, the substrate may include a first base layer, a first barrier layer on the first base layer, a second base layer on the first barrier layer, and a second barrier layer on the second base layer.

In an embodiment, the upper layer of the multiple layer may include the second barrier layer, and the lower layer of the multiple layer may include the second base layer.

In an embodiment, the second barrier layer may include an inorganic material, and the second base layer may include an organic material.

In an embodiment, the upper layer of the multiple layer may include an inorganic layer, and the lower layer of the multiple layer may include an organic layer located under the inorganic layer.

In an embodiment, the display device may further include a thin film encapsulation layer disposed on the display element, where the thin film encapsulation layer includes an inorganic encapsulation layer and an organic encapsulation layer, where the inorganic encapsulation layer may continuously cover an inner surface of the groove.

BRIEF DESCRIPTION OF THE DRAWINGS

The above and other features of embodiments will be more apparent from the following description taken in conjunction with the accompanying drawings, in which.

DETAILED DESCRIPTION

Figure 1:
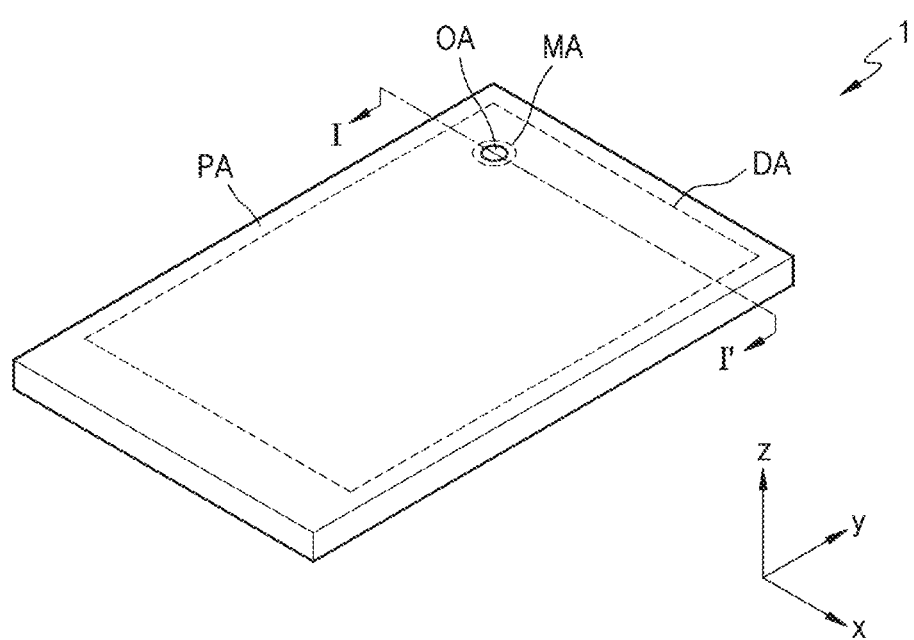
FIG. 1 is a perspective view schematically illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when a layer, region, or element is referred to as being "on" another layer, region, or element, it may be "directly on" the other layer, region, or element or may be "indirectly on" the other layer, region, or element with one or more intervening layers, regions, or elements therebetween.

Sizes of elements in the drawings may be exaggerated for convenience of description. In other words, because the sizes and thicknesses of elements in the drawings are arbitrarily illustrated for convenience of description, the present disclosure is not limited thereto.

When a certain embodiment may be implemented differently, a particular process order may be performed differently from the described order. For example, two consecutively described processes may be performed substantially at the same time or performed in an order opposite to the described order.

It will be understood that when a layer, region, or element is referred to as being "connected to" another layer, region, or element, it may be "directly connected to" the other layer, region, or element or may be "indirectly connected to" the other layer, region, or element with one or more intervening layers, regions, or elements therebetween. For example, it will be understood that when a layer, region, or element is referred to as being "electrically connected to" another layer, region, or element, it may be "directly electrically connected to" the other layer, region, or element and/or may be "indirectly electrically connected to" the other layer, region, or element with one or more intervening layers, regions, or elements therebetween.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

FIG. 1 is a perspective view schematically illustrating a display device according to an embodiment.

Referring to FIG. 1, an embodiment of a display device 1 may include a transmission area (also referred to as a first area) OA and a display area DA (also referred to as a second area) at least partially surrounding the first area OA. The display device 1 may provide a certain image by using light emitted from a plurality of pixels arranged in the display area DA. The first area OA may be entirely surrounded by the display area DA. The first area OA may be a transmission area as an area in which a component is arranged, as described below with reference to FIG. 2. In such an embodiment, the display area DA may be defined on a plane defined by an x direction (or a first direction) and a y direction (or a second direction), which are perpendicular to a z direction (or a third direction), which is a thickness direction of the display device.

An intermediate area MA (also referred to as a third area) may be arranged between the first area OA and the display area DA, and the display area DA may be surrounded by a peripheral area PA (also referred to as a fourth area). The intermediate area MA and the peripheral area PA may be a type of non-display area in which pixels are not arranged. The intermediate area MA may be entirely surrounded by the display area DA, and the display area DA may be entirely surrounded by the peripheral area PA.

Hereinafter, for convenience of description, embodiments where the display device 1 is an organic light emitting display device will be described in detail, but the display device of the present disclosure is not limited thereto. In an alternative embodiment, the display device 1 may be a display device such as an inorganic light emitting display device (e.g., an inorganic electroluminescence ("EL") display device) or a quantum dot light emitting display device.

FIG. 1 illustrates an embodiment where a single first area OA is provided and is substantially circular, but the disclosure is not limited thereto. Alternatively, the number of the first area OA may be two or greater, and the shape thereof may be variously modified to be in another shape, such as circular, elliptical, polygonal, star, and diamond shapes, for example.

Figure 2:
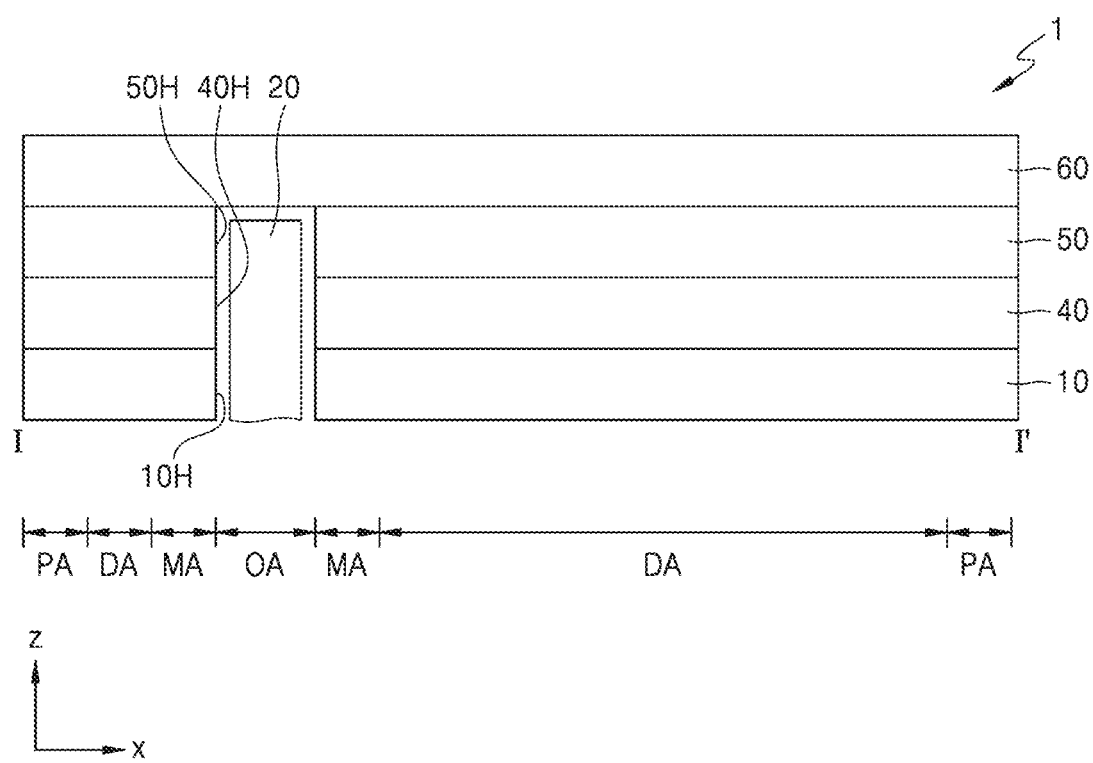
FIGS. 2 and 3 are cross-sectional views schematically illustrating a display device according to an embodiment.
Figure 3:
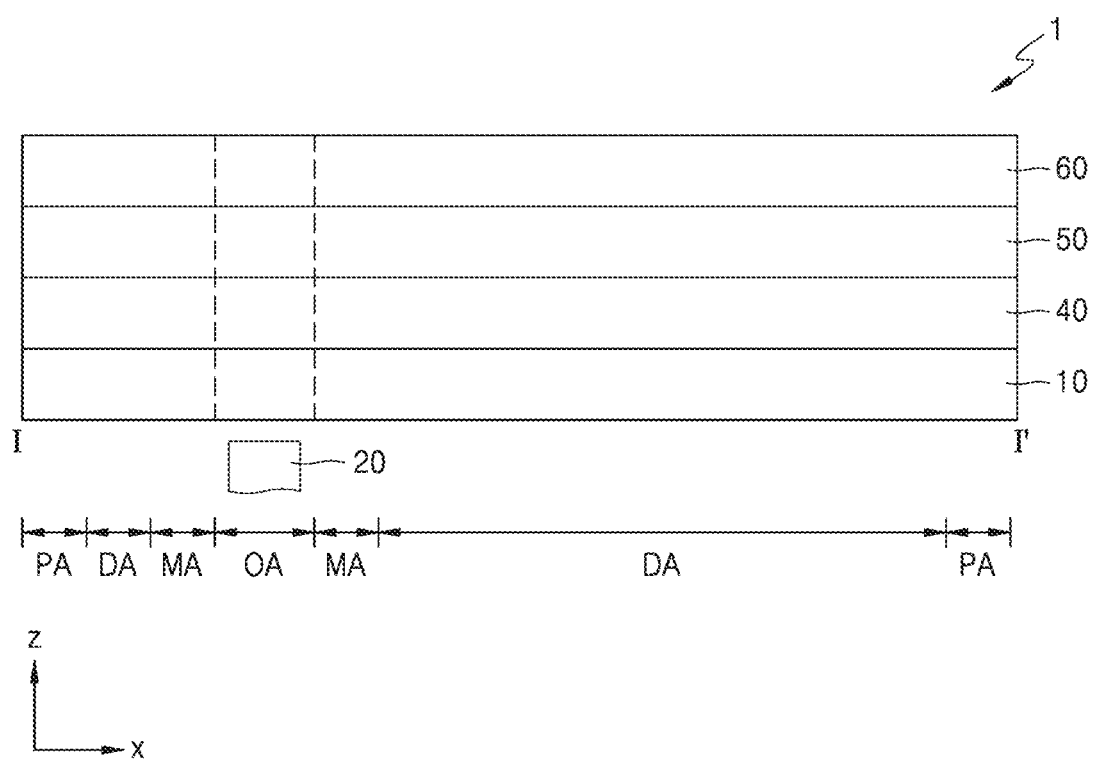

FIGS. 2 and 3 are cross-sectional views schematically illustrating a display device according to an embodiment, which may correspond to a cross-section of the display device taken along line I-I' of FIG. 1.

Referring to FIG. 2, an embodiment of a display device 1 may include a display panel 10, an input sensing layer 40 and an optical functional layer 50 arranged on the display panel 10, which may be covered by a window 60. The display device 1 may be provided in various electronic devices such as mobile phones, laptop computers, or smart watches, for example.

The display panel 10 may display an image. The display panel 10 may include pixels arranged in the display area DA. The pixels may include a display element. The display element may be connected to a pixel circuit. The display element may include an organic light emitting diode or a quantum dot organic light emitting diode.

The input sensing layer 40 may be configured to detect coordinate information corresponding to an external input, for example, a touch event. The input sensing layer 40 may include a sensing electrode or a touch electrode and trace lines connected to the sensing electrode. The input sensing layer 40 may be arranged on the display panel 10. The input sensing layer 40 may be configured to sense an external input by a mutual capacitance method and/or a self capacitance method.

The input sensing layer 40 may be directly formed on the display panel 10 or may be separately formed and then coupled to the display panel 10 through an adhesive layer such as an optical clear adhesive. In one embodiment, for example, the input sensing layer 40 may be subsequently formed after a process of forming the display panel 10, and in such an embodiment, the input sensing layer 40 may be a portion of the display panel 10 and an adhesive layer may not be arranged between the input sensing layer 40 and the display panel 10. In an embodiment, as shown in FIG. 2, the input sensing layer 40 may be arranged between the display panel 10 and the optical functional layer 50. Alternatively, the input sensing layer 40 may be arranged on the optical functional layer 50.

The optical functional layer 50 may include an anti-reflection layer. The anti-reflection layer may be configured to reduce the reflectance of light (external light) incident from the outside through the window 60 toward the display panel 10. The anti-reflection layer may include a phase retarder and a polarizer. The phase retarder may be a film type or a liquid crystal coating type and may include a $\lambda/2$ phase retarder and/or a $\lambda/4$ phase retarder. The polarizer may be a film type or a liquid crystal coating type. In an embodiment where the polarizer is the film type, the polarizer may include a stretched synthetic resin film. In an embodiment where the polarizer is the liquid crystal coating type, the polarizer may include liquid crystals arranged in a certain arrangement. The phase retarder or the polarizer may further include a protection film. The phase retarder or the polarizer itself or the protection film may be defined as a base layer of the anti-reflection layer.

In an alternative embodiment, the anti-reflection layer may include a black matrix and color filters. The color filters may be arranged based on the color of light emitted from each of the pixels of the display panel 10. In another alternative embodiment, the anti-reflection layer may include a destructive interference structure. The destructive interference structure may include a first reflective layer and a second reflective layer arranged in different layers from each other. First reflected light and second reflected light respectively reflected by the first reflective layer and the second reflective layer may destructively interfere with each other, and accordingly, the external light reflectance may be reduced.

The optical functional layer 50 may include a lens layer. The lens layer may be configured to improve the light emission efficiency of light emitted from the display panel 10 or may be configured to reduce a color deviation. The lens layer may include a layer having a concave or convex lens shape and/or may include a plurality of layers having different refractive indexes from each other. The optical functional layer 50 may include both the anti-reflection layer and the lens layer described above or may include any one of the anti-reflection layer and the lens layer.

In an embodiment, the optical functional layer 50 may be subsequently formed after a process of forming the display panel 10 and/or the input sensing layer 40. In such an embodiment, an adhesive layer may not be arranged between the optical functional layer 50 and the display panel 10 and/or the input sensing layer 40.

In an embodiment, an opening may be defined or formed through the display panel 10, the input sensing layer 40, and/or the optical functional layer 50. In such an embodiment, as shown in FIG. 2, first to third openings 10H, 40H, and 50H may be defined through the display panel 10, the input sensing layer 40, and the optical functional layer 50, respectively, and the first to third openings 10H, 40H, and 50H may overlap each other. The first to third openings 10H, 40H, and 50H may be located to correspond to the first area OA. In an alternative embodiment, no opening is defined through at least one of the display panel 10, the input sensing layer 40, and the optical functional layer 50. In one embodiment, for example, no opening is defined through any one or two of the display panel 10, the input sensing layer 40, and the optical functional layer 50. Alternatively, no opening is defined through the display panel 10, the input sensing layer 40, and the optical functional layer 50, as illustrated in FIG. 3.

In an embodiment, as described above, the first area OA may be a type of component area (e.g., sensor area, camera area, or speaker area) in which a component 20 for performing various functions for the display device 1 is located. In an embodiment, the component 20 may be located in the first to third openings 10H, 40H, and 50H, as illustrated in FIG. 2. Alternatively, the component 20 may be arranged under the display panel 10, as illustrated in FIG. 3.

The component 20 may include an electronic element. In one embodiment, for example, the component 20 may include an electronic element using light or sound. In one embodiment, for example, the electronic element may include a sensor such as an infrared sensor for outputting and/or receiving light, a camera for receiving light to capture an image, a sensor for outputting and sensing light or sound to measure a distance or recognize a fingerprint, a miniature lamp for outputting light, or a speaker for outputting sound. In an embodiment, where an electronic element uses light, the electronic element may use light of various wavelength bands such as visible light, infrared light, and ultraviolet light. In such an embodiments, the first area OA may be a transmission area through which light and/or sound output from the component 20 to the outside or propagating from the outside toward the electronic element may be transmitted.

In an alternative embodiment, where the display device 1 is used as a smart watch or a vehicle instrument panel, the component 20 may be an element such as a clock hand or a needle indicating certain information (e.g., vehicle speed). When the display device 1 includes a clock hand or a vehicle instrument panel, the component 20 may be exposed to the outside through the window 60, and an opening corresponding to the first area OA may be defined through the window 60.

The component 20 may include one or more elements related to the function of the display panel 10 as described above or may include elements such as accessories for decoration of the display panel 10. In such an embodiment, although not illustrated in FIGS. 2 and 3, a layer including an optical clear adhesive or the like may be located between the window 60 and the optical functional layer 50.

FIGS. 4A to 4D are cross-sectional views schematically illustrating a display panel according to various embodiments. FIG. 4E is an enlarged view of the encircled portion of FIG. 4A.

Figure 4A:
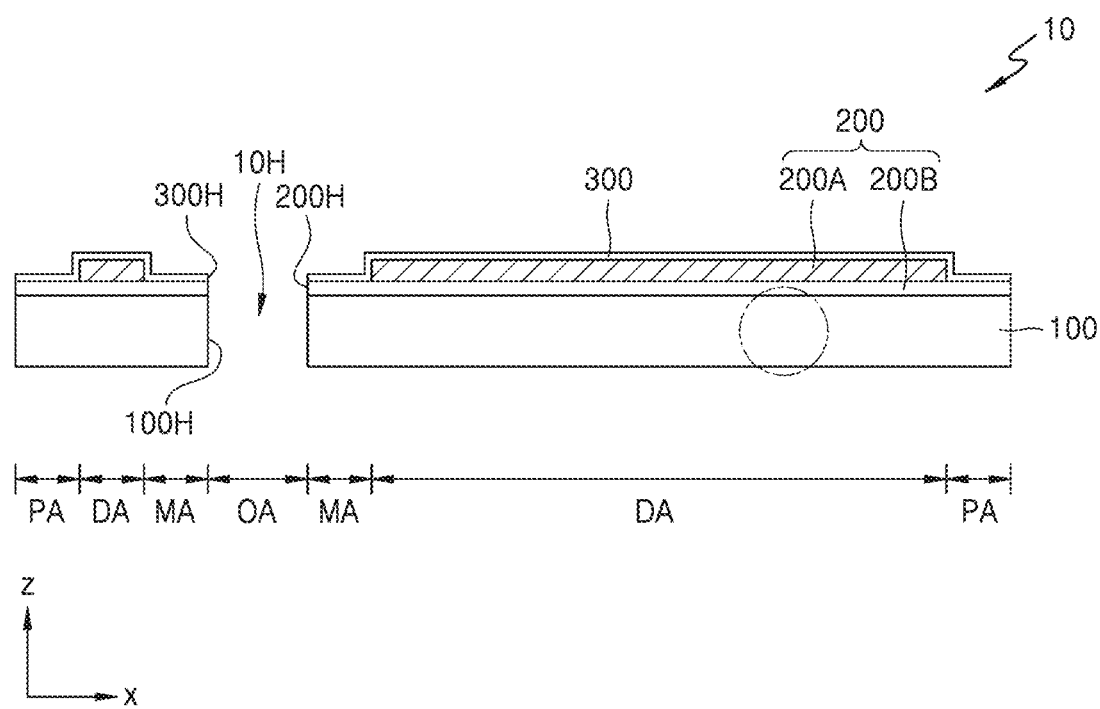
FIGS. 4A to 4D are cross-sectional views schematically illustrating a display panel according to various embodiments.

Referring to FIG. 4A, a display panel 10 may include a display layer 200 arranged on a substrate 100. The substrate 100 may include a glass material or a polymer resin. The substrate 100 may include a multiple layer or have a multi-layer structure. In one embodiment, for example, the substrate 100 may include a first base layer 101, a first barrier layer 102, a second base layer 103, and a second barrier layer 104, as illustrated in FIG. 4E.

The first base layer 101 and the second base layer 103 may each include a polymer resin. In one embodiment, for example, the first base layer 101 and the second base layer 103 may include a polymer resin such as polyethersulphone ("PES"), polyacrylate ("PAR"), polyetherimide ("PEI"), polyethylene naphthalate ("PEN"), polyethylene terephthalate ("PET"), polyphenylene sulfide ("PPS"), polyimide ("PI"), polycarbonate ("PC"), cellulose triacetate ("TAC"), and cellulose acetate propionate (CAP). The above polymer resin may be transparent.

The first barrier layer 102 and the second barrier layer 104 may include layers for preventing penetration of external foreign materials and may have a single layer structure or a multi-layer structure, each layer including an inorganic material such as silicon nitride ($SiN_x$) and silicon oxide ($SiO_x$).

The display layer 200 may include a plurality of pixels. The display layer 200 may include a display element layer 200A including a display element of each pixel, and a pixel circuit layer 200B including insulating layers and a pixel circuit connected to the display element. The display element layer 200A may include a pixel electrode, an opposite electrode, and a stack structure therebetween, and the display element may be an organic light emitting diode. The pixel circuit may include a thin film transistor and a storage capacitor.

The display elements of the display layer 200 may be covered with an encapsulation member such as a thin film encapsulation layer 300, and the thin film encapsulation layer 300 may include an inorganic encapsulation layer and an organic encapsulation layer. In an embodiment where the display panel 10 includes a substrate 100 including a polymer resin, and a thin film encapsulation layer 300 including an inorganic encapsulation layer and an organic encapsulation layer, such that the flexibility of the display panel 10 may be improved.

In an embodiment, a first opening 10H is defined through the display panel 10. The first opening 10H may be located in the first area OA, and in such an embodiment, the first area OA may be a type of opening area. FIG. 4A illustrates an embodiment where through holes 100H and 300H corresponding to the first opening 10H of the display panel 10 are defined through the substrate 100 and the thin film encapsulation layer 300, respectively. In such an embodiment, a through hole 200H corresponding to the first area OA is also defined through the display layer 200.

Figure 4B:
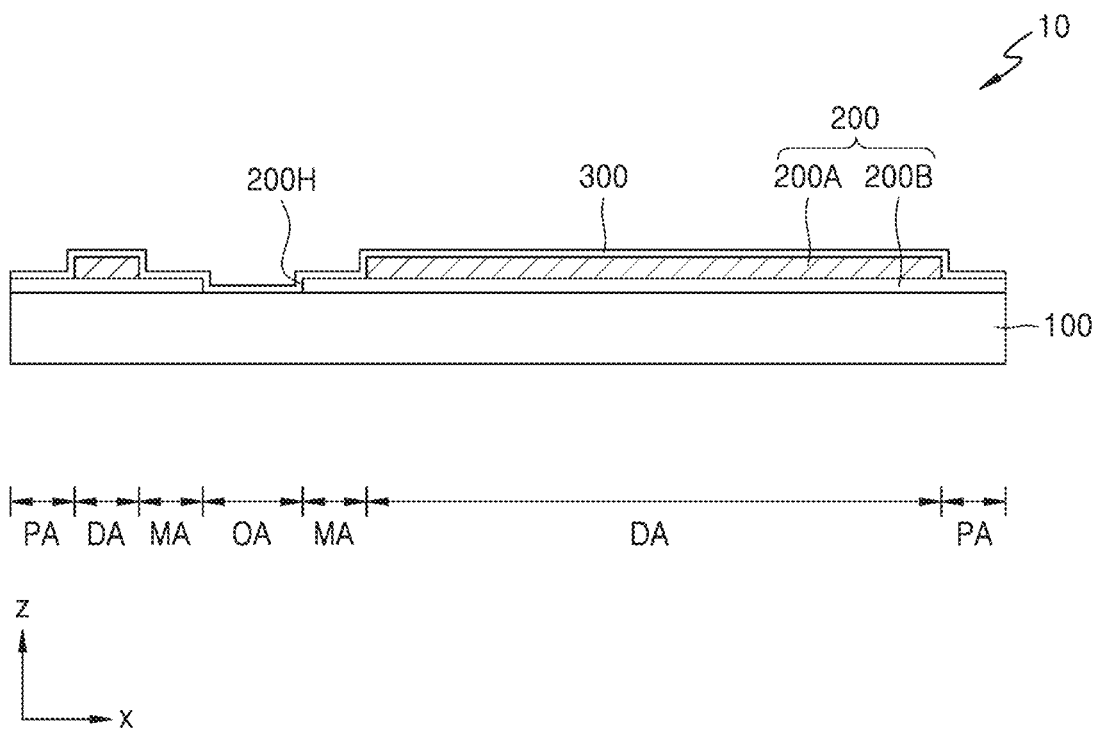

In an alternative embodiment, as illustrated in FIG. 4B, a through hole corresponding to the first area OA is not defined through the substrate 100. In such an embodiment, a through hole 200H corresponding to the first area OA is defined through the display layer 200, while a through hole corresponding to the first area OA is not defined through the thin film encapsulation layer 300. In another alternative embodiment, as illustrated in FIG. 4C, a through hole 200H corresponding to the first area OA is not defined through the display layer 200.

Figure 4C:
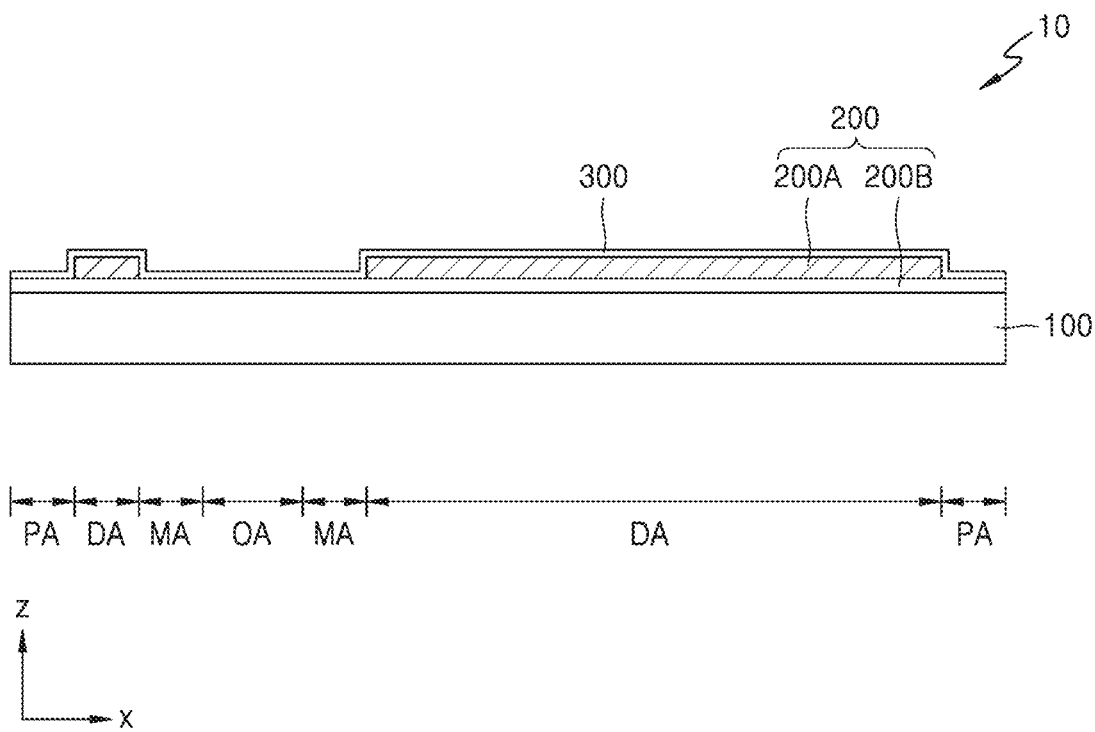
Figure 4D:
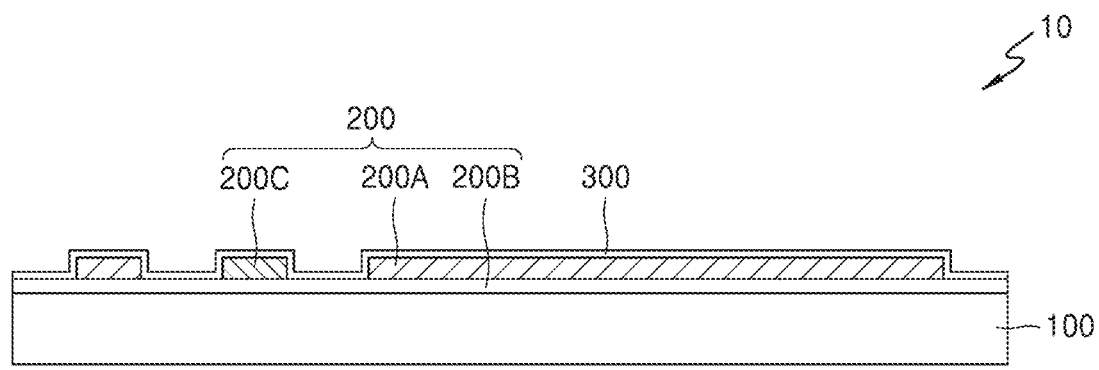
Figure 4E:
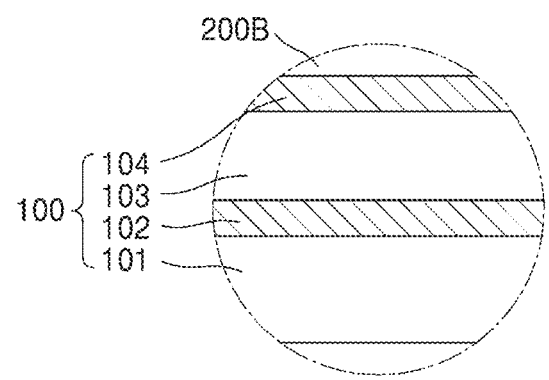
FIG. 4E is an enlarged view of the encircled portion of FIG. 4A.

Although FIGS. 4A to 4C illustrate embodiments where the display element layer 200A is not arranged in the first area OA, the disclosure is not limited thereto. In another alternative embodiment, as illustrated in FIG. 4D, an auxiliary display element layer 200C may be located in the first area OA. The auxiliary display element layer 200C may include a display element that has a different structure and/or operates a different way from the display element of the display element layer 200A.

In such an embodiment, each pixel of the display element layer 200A may include an active organic light emitting diode, and the auxiliary display element layer 200C may include pixels, each including a passive organic light emitting diode. In such an embodiment, where the auxiliary display element layer 200C includes a display element of a passive organic light emitting diode, elements constituting a pixel circuit may not be under the passive organic light emitting diode. In one embodiment, for example, a portion of the pixel circuit layer 200B under the auxiliary display element layer 200C may not include a transistor and a storage capacitor.

In another alternative embodiment, the auxiliary display element layer 200C may include a display element of a same type as the display element layer 200A (e.g., an active organic light emitting diode), but the structure of a pixel circuit thereunder may be different from that of the display element layer 200A. In one embodiment, for example, the pixel circuit under the auxiliary display element layer 200C (e.g., a pixel circuit including a light blocking layer between a substrate and a transistor) may include a different structure from the pixel circuit under the display element layer 200A. Alternatively, the display elements of the auxiliary display element layer 200C may operate based on different control signals from the display elements of the display element layer 200A. Components (e.g., infrared sensors) that may effectively operate under a layer having a relatively low transmittance may be arranged in the first area OA in which the auxiliary display element layer 200C is arranged. In such an embodiment, the first area OA may be a component area and an auxiliary display area.

Figure 5:
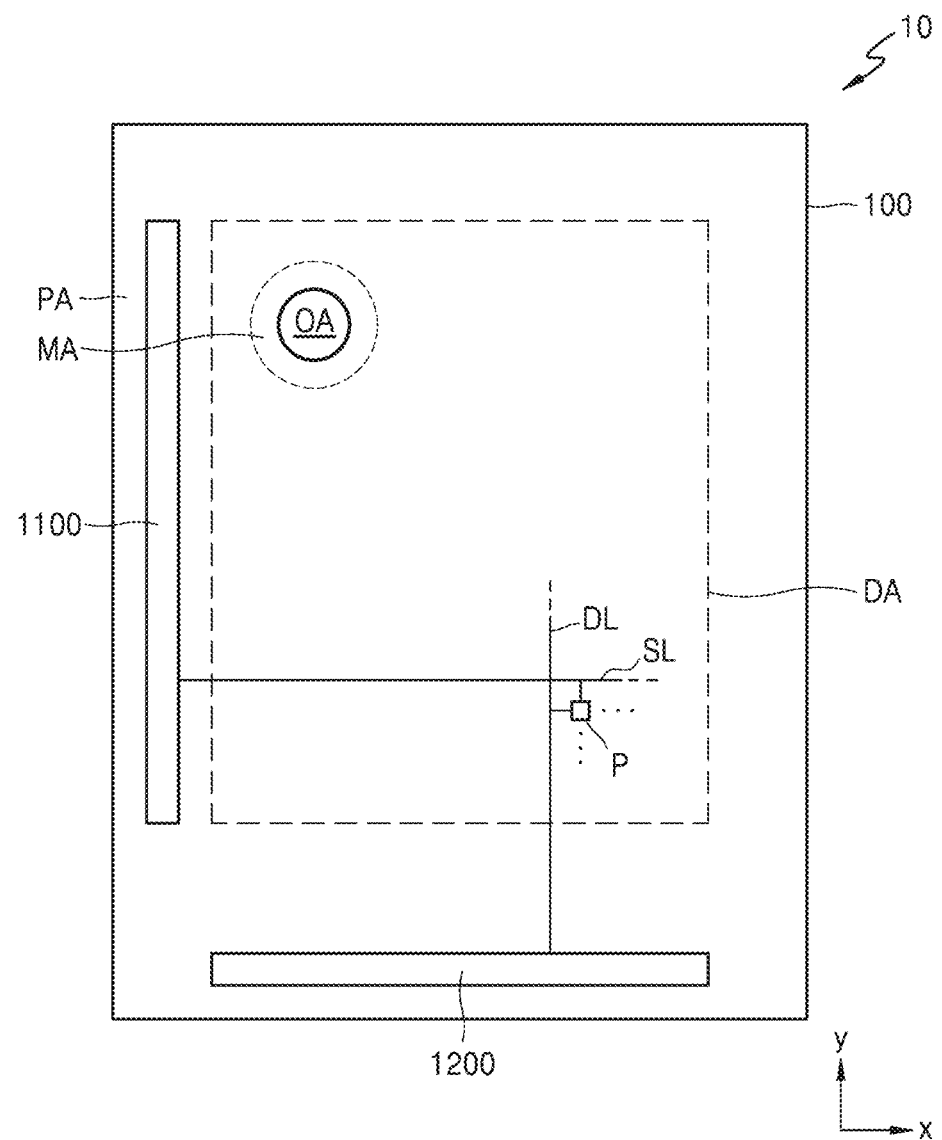
FIG. 5 is a plan view schematically illustrating a display panel according to an embodiment.
Figure 6:
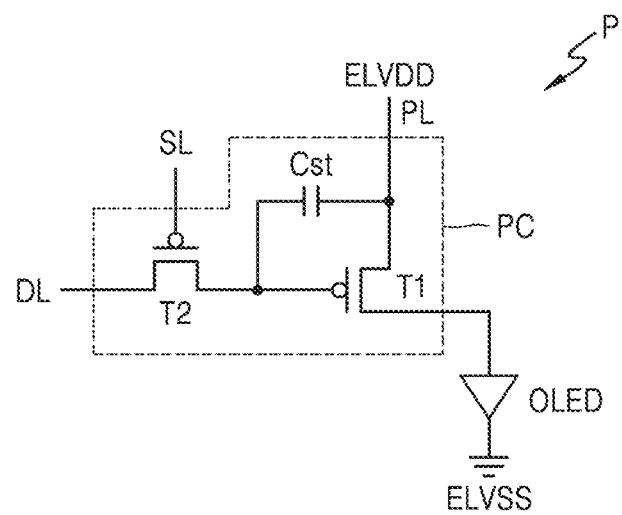
FIG. 6 is an equivalent circuit diagram schematically illustrating a pixel of a display panel according to an embodiment.

FIG. 5 is a plan view schematically illustrating a display panel according to an embodiment, and FIG. 6 is an equivalent circuit diagram schematically illustrating a pixel of a display panel according to an embodiment.

Referring to FIG. 5, an embodiment of a display panel 10 may include a first area OA, a display area DA (or a second area), an intermediate area MA (or a third area), and a peripheral area PA (or a fourth area). FIG. 5 illustrates a substrate 100 of the display panel 10, and for example, the substrate 100 may include the first area OA, the display area DA, the intermediate area MA, and the peripheral area PA.

The display panel 10 may include a plurality of pixels P arranged in the display area DA. In an embodiment, as illustrated in FIG. 6, each pixel P may include an organic light emitting diode OLED as a display element, and the organic light emitting diode OLED may be connected to a pixel circuit PC. The pixel circuit PC may include a first transistor T1, a second transistor T2, and a capacitor Cst. Each pixel P may emit, for example, red, green, blue, or white light from the organic light emitting diode OLED.

In such an embodiment, the second transistor T2 (or a switching transistor) may be connected to a scan line SL and a data line DL and may be configured to transmit a data voltage input from the data line DL to the first transistor T1, based on a switching voltage input from the scan line SL. The capacitor Cst may be connected to the second transistor T2 and a driving voltage line PL and may be configured to store a voltage corresponding to the difference between a voltage received from the second transistor T2 and a first power voltage ELVDD supplied to the driving voltage line PL.

In such an embodiment, the first transistor T1 (or a driving transistor) may be connected to the driving voltage line PL and the capacitor Cst and may be configured to control a driving current flowing from the driving voltage line PL through the organic light-emitting diode OLED in response to a voltage value stored in the capacitor Cst. The organic light emitting diode OLED may emit light with a certain brightness corresponding to the driving current. An opposite electrode (e.g., a cathode) of the organic light-emitting diode OLED may be supplied with a second power voltage ELVSS.

Although FIG. 6 illustrates an embodiment where the pixel circuit PC includes two transistors and a single capacitor, the disclosure is not limited thereto. The number of the transistors and the number of the capacitors may be variously modified according to the design of the pixel circuit PC. In one alternative embodiment, for example, the pixel circuit PC may further include four or five or more transistors in addition to the two transistors described above.

Referring back to FIG. 5, the intermediate area MA may surround the first area OA on a plan view. The intermediate area MA may be an area in which a display element such as an organic light emitting diode for emitting light is not arranged, and signal lines for providing signals to pixels P arranged around the first area OA may pass through the intermediate area MA. In an embodiment, a scan driver 1100 for providing a scan signal to the pixel circuit PC of each pixel P, a data driver 1200 for providing a data signal to the pixel circuit PC of each pixel P, and main power lines (not illustrated) for providing the first power voltage and the second power voltage may be arranged in the peripheral area PA. FIG. 5 illustrates an embodiment where the data driver 1200 is arranged on one side portion of the substrate 100, but not being limited thereto. In an alternative embodiment, the data driver 1200 may be arranged on a flexible printed circuit board ("FPCB") electrically connected to a pad arranged at one side portion of the display panel 10.

Figure 7:
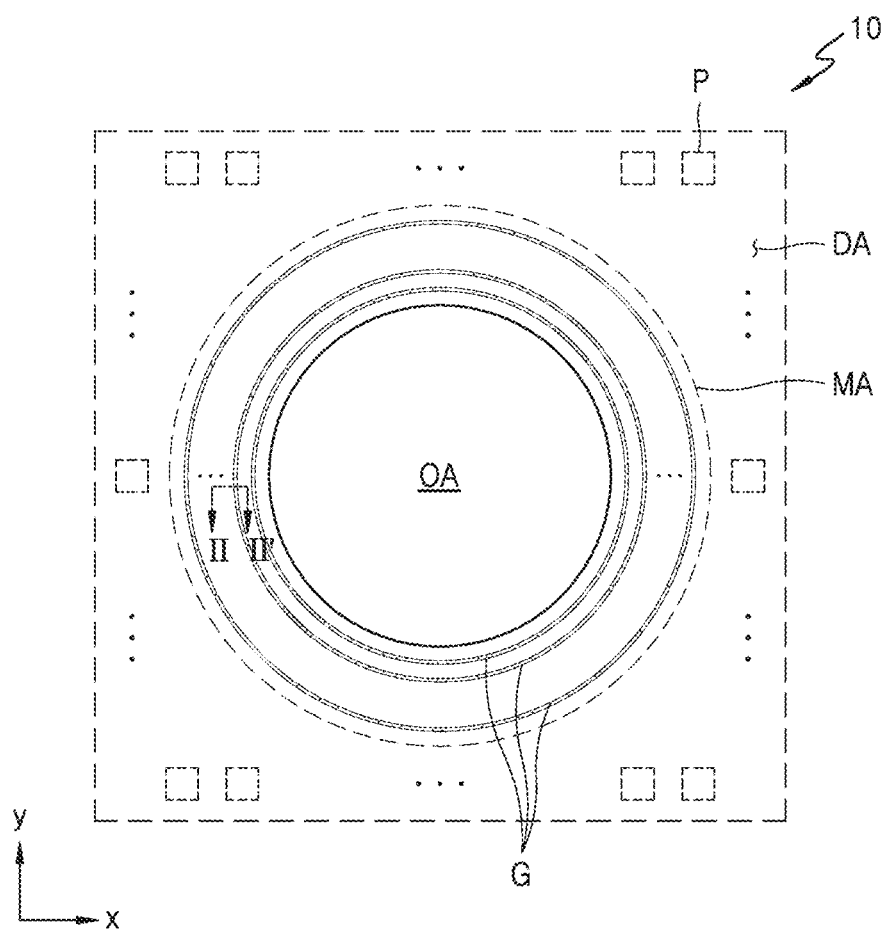
FIG. 7 is a plan view illustrating a portion of a display panel according to an embodiment.
Figure 8:
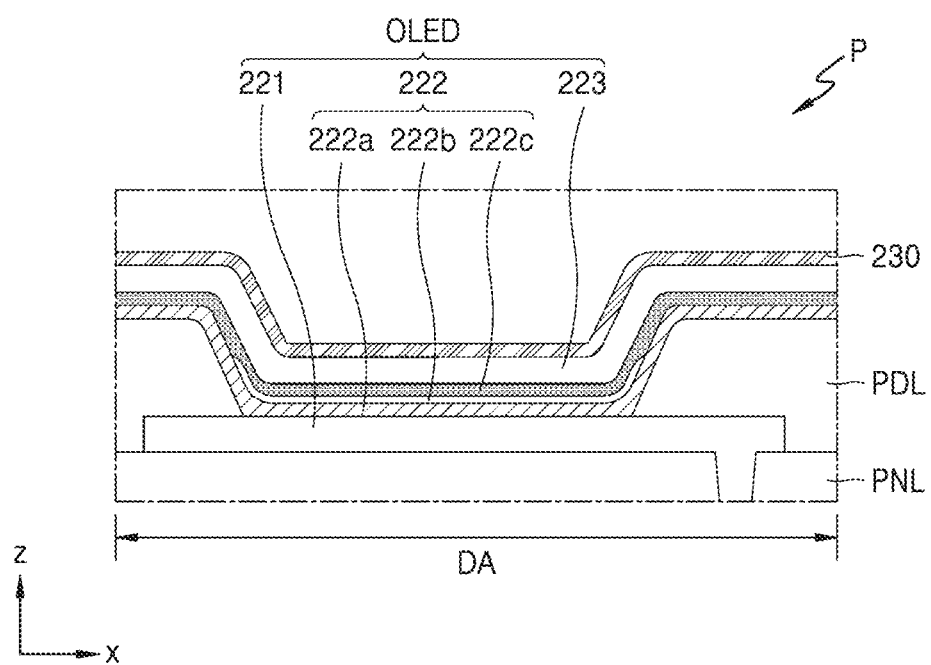
FIG. 8 is a cross-sectional view schematically illustrating a pixel of a display panel according to an embodiment.

FIG. 7 is a plan view illustrating a portion of a display panel according to an embodiment, and FIG. 8 is a cross-sectional view schematically illustrating a pixel of a display panel according to an embodiment. For convenience of illustration and description, a thin film encapsulation layer (or an encapsulation member) is omitted in FIG. 8.

Referring to FIG. 7, in an embodiment of a display panel, pixels P may be arranged in the display area DA around the first area OA. The first area OA may be defined between the pixels P. In one embodiment, for example, on a plan view, pixels P may be arranged the up and down sides of the first areas OA, and pixels P may be arranged on the left and right sides of the first area OA.

Each pixel P may include an organic light emitting diode OLED, as illustrated in FIG. 8. The organic light emitting diode OLED may include a pixel electrode 221, an opposite electrode 223 opposite to the pixel electrode 221, and an intermediate layer 222 between the pixel electrode 221 and the opposite electrode 223.

The pixel electrode 221 may be located on a planarization layer PNL. In an embodiment, the pixel electrode 221 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an alternative embodiment, the pixel electrode 221 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a combination thereof. In another alternative embodiment, the pixel electrode 221 may further include a layer including or formed of a reflective layer and a conductive oxide layer over/under the reflective layer.

A pixel definition layer PDL may be disposed on the pixel electrode 221. An opening exposing the upper surface of the pixel electrode 221 may be defined through the pixel definition layer PDL, and the pixel definition layer PDL may cover the edge of the pixel electrode 221. The pixel definition layer PDL may include an organic insulating material. Alternatively, the pixel definition layer PDL may include an organic insulating material and an inorganic insulating material.

The intermediate layer 222 may include an emission layer 222b. The intermediate layer 222 may include a first functional layer 222a arranged under the emission layer 222b and/or a second functional layer 222c arranged on the emission layer 222b. The emission layer 222b may include a high-molecular or low-molecular weight organic material for emitting light of a certain color.

The first functional layer 222a may include a single layer or a multiple layer. For example, when the first functional layer 222a is formed of a high-molecular weight material, the first functional layer 222a may include a hole transport layer ("HTL") having a single-layer structure and including or formed of poly-(3,4)-ethylene-dihydroxy thiophene ("PEDOT") or polyaniline ("PANI"). In an embodiment where the first functional layer 222a is formed of a low-molecular weight material, the first functional layer 222a may include a hole injection layer ("HIL") and an HTL.

In an alternative embodiment, the second functional layer 222c may be omitted. In an embodiment, for example, where the first functional layer 222a and the emission layer 222b are formed of a high-molecular weight material, the second functional layer 222c may be provided. The second functional layer 222c may have a single layer structure or a multi-layer structure. The second functional layer 222c may include an electron transport layer ("ETL") and/or an electron injection layer ("EIL").

The emission layer 222b of the intermediate layer 222 may be arranged for each pixel. In one embodiment, for example, the emission layer 222b may be patterned to correspond to the pixel electrode 221. Unlike the emission layer 222b, the first functional layer 222a and/or the second functional layer 222c of the intermediate layer 222 may be integrally formed as a single body to correspond to a plurality of pixels P, respectively.

The opposite electrode 223 may include a conductive material having a low work function. In one embodiment, for example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a combination (e.g., an alloy) thereof. Alternatively, the opposite electrode 223 may further include a conductive oxide layer such as ITO, IZO, ZnO, or $In_2O_3$ on the (semi)transparent layer including at least one selected from the above listed materials. The opposite electrode 223 may be disposed or formed on the intermediate area MA as well as on the display area DA. The first functional layer 222a, the second functional layer 222c, and the opposite electrode 223 may be formed by a thermal evaporation.

A capping layer 230 may be located on the opposite electrode 223. In one embodiment, for example, the capping layer 230 may include LiF and may be formed by a thermal evaporation. In an alternative embodiment, the capping layer 230 may be omitted.

Among the layers provided in the display panel, one or more layers including an organic material may provide a path through which moisture passes. Because the first functional layer 222a and/or the second functional layer 222c included in the stack structure of the organic light emitting diode OLED may also include an organic material, the organic material may provide a path through which moisture passes. In such an embodiment, the first functional layer 222a and/or the second functional layer 222c may be disconnected or separated by grooves G provided in the intermediate area MA, such that the above-described moisture permeation and damage to the organic light emitting diode OLED according thereto may be effectively prevented.

In an embodiment, as illustrated in FIG. 7, one or more grooves G may be located in the intermediate area MA. On the plan view illustrated in FIG. 7, the grooves G may each have a ring shape surrounding the first area OA and the grooves G may be spaced apart from each other.

The groove G may be formed in a multiple layer including a plurality of layers, and the groove G formed concavely in the depth direction of the multiple layer may have an undercut structure. The structure of the multiple layer and the grooves G will hereinafter be described in detail with reference to FIGS. 9A to 9F.

FIGS. 9A to 9D are cross-sectional views of grooves provided in a display panel according to various embodiments. FIGS. 9A to 9D may correspond to a cross-section of the display panel taken along line II-II' of FIG. 7.

Referring to FIGS. 9A to 9D, in an embodiment of a display panel, a multiple layer ML in the intermediate area MA under the first functional layer 222a may include a lower layer LL and an upper layer UL, and the lower layer LL and/or the upper layer UL may include a plurality of sublayers.

The lower layer LL and the upper layer UL may include different materials from each other. In one embodiment, for example, the lower layer LL may include an organic material such as an organic insulating material, and the upper layer UL may include an inorganic material.

The lower layer LL may include an organic insulating material such as a general-purpose polymer such as polymethylmethacrylate ("PMMA") or polystyrene ("PS"), a polymer derivative having a phenolic group, an acrylic polymer, an imide-based polymer, an arylether-based polymer, an amide-based polymer, a fluorine-based polymers, a p-xylene-based polymer, a vinyl alcohol-based polymer, or a combination (e.g., a blend) thereof.

The inorganic material of the upper layer UL may be a material distinguished from an organic material including carbon and may include a conductive oxide such as IZO, ITO, zinc oxide (ZnO), indium oxide ($In_2O_3$), IGO, and/or AZO. Alternatively, the inorganic material of the upper layer UL may include a metal such as molybdenum (Mo), aluminum (Al), copper (Cu), and/or titanium (Ti). Alternatively, the inorganic material of the upper layer UL may include an insulating material such as silicon nitride, silicon oxide, and/or silicon oxynitride.

Figure 9A:
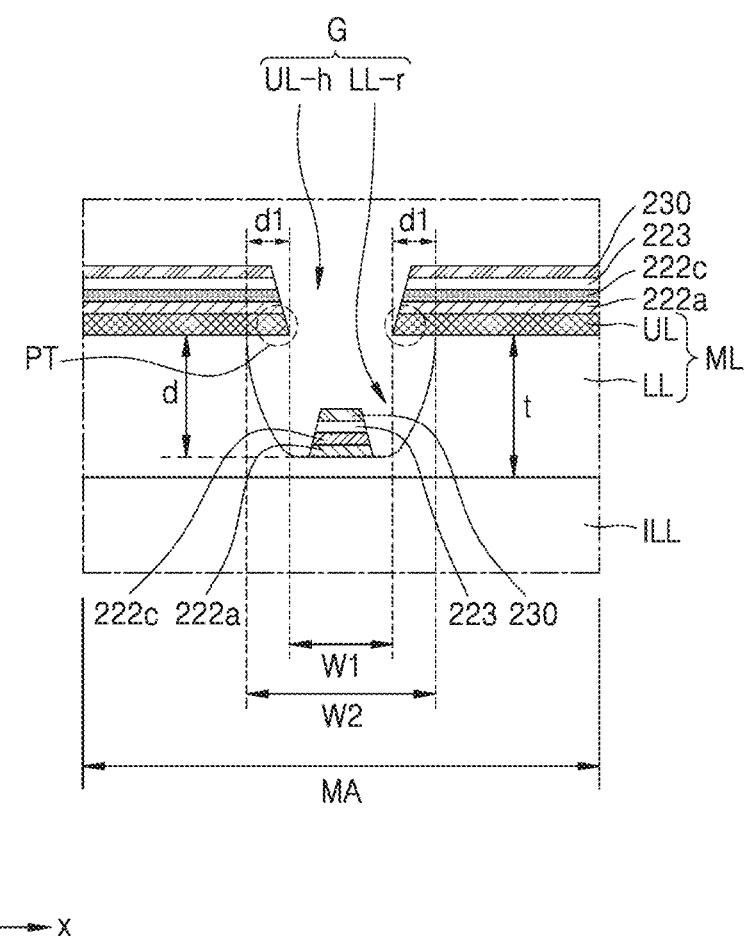
FIGS. 9A to 9D are cross-sectional views of grooves provided in a display panel according to various embodiments.
Figure 9B:
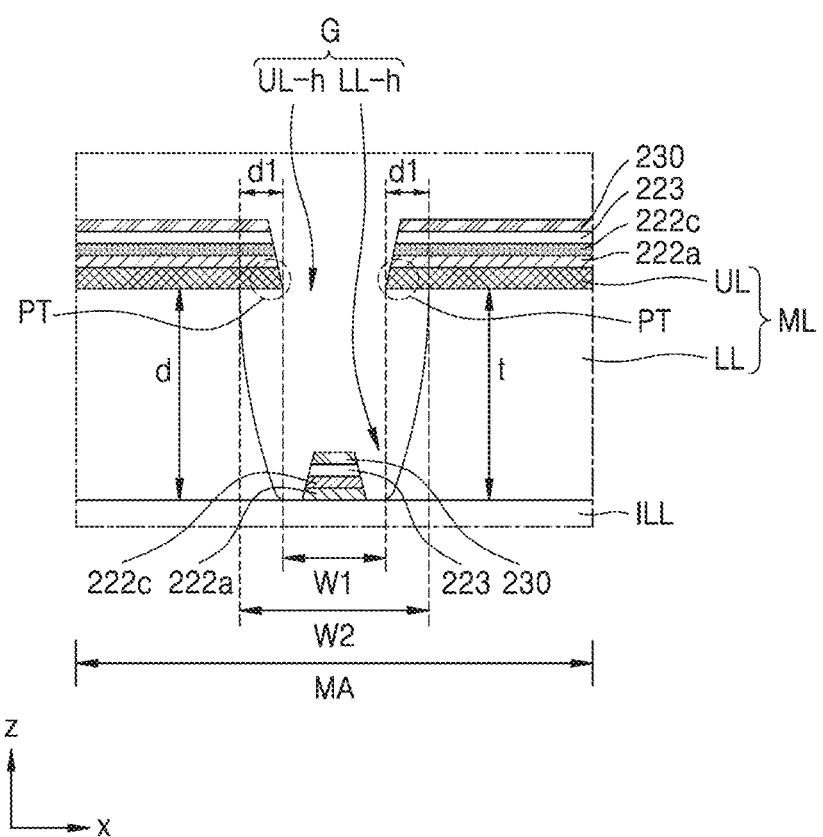

A groove G may be defined or formed in the multiple layer ML in a thickness direction thereof or the z direction. The groove G may include an upper hole UL-h defined or formed through the upper layer UL, and a lower hole or lower recess formed in the lower layer LL. In an embodiment, as illustrated in FIG. 9A, the groove G may include an upper hole UL-h of the upper layer UL and a recess LL-r of the lower layer LL, and the upper hole UL-h and the recess LL-r may be spatially connected to each other to collectively form the groove G. Alternatively, as illustrated in FIG. 9B, the groove G may include an upper hole UL-h of the upper layer UL and a lower hole LL-h defined or formed through the lower layer LL, and the upper hole UL-h and the lower-hole LL-h may be spatially connected to each other to form the groove G. Herein, a depth of the groove G may be defined as a depth d of the lower hole or lower recess in the lower layer LL thereof. In an embodiment, the depth d of the groove G may be less than a thickness t of the lower layer LL, and a bottom surface of the groove G may be between the top surface and the bottom surface of the lower layer LL (FIG. 9A). Alternatively, the depth d of the groove G may be equal to the thickness t of the lower layer LL, and the bottom surface of the groove G may be located in a same surface as the bottom surface of the lower layer LL (FIG. 9B).

The bottom surface of the groove G may be located on the bottom surface of the lower layer LL or on the top surface of a layer ILL under the lower layer LL. The layer ILL may include an insulating material such as an organic insulating material or an inorganic insulating material.

The groove G may have an undercut structure. In an embodiment, as illustrated in FIGS. 9A and 9B, a first width W1 of the upper hole UL-h may be less than a second width W2 of the lower layer LL. The ends of the upper layer UL protruding toward the groove G, for example, toward the center of the groove G, may form tips PT. A protrusion length d1 of each tip PT may be less than the depth d of the groove G. The protrusion length d1 of the tip PT may be less than about 2 micrometers (μm). In one embodiment, for example, the protrusion length d1 of the tip PT may be in a range of about 1 μm to 1.5 μm. The depth d of the groove G may be about 2 μm or greater, about 2.5 μm or greater, about 3 μm or greater, or about 3.5 μm or greater.

In an embodiment, the organic layer(s) included in the stack structure of the organic light emitting diode OLED (see FIG. 8) described above with reference to FIGS. 7 and 8 may be disconnected or separated by the groove G. In such an embodiment, an opening is defined or formed through the organic layer(s) included in the stack structure of the organic light emitting diode OLED to correspond (or be connected) to the groove G. In such an embodiment, the groove G may be collectively defined by the upper hole UL-h defined or formed through the upper layer UL, the lower hole or lower recess formed in the lower layer LL, and the opening defined or formed through the organic layer(s) included in the stack structure of the organic light emitting diode OLED. In one embodiment, for example, the first functional layer 222a and the second functional layer 222c may be disconnected or separated by the groove G, as illustrated in FIGS. 9A and 9B. In such an embodiment, the opposite electrode 223 and the capping layer 230 may be disconnected or separated by the groove G. Although FIGS. 9A and 9B and the following drawings illustrate embodiments where the first functional layer 222a, the second functional layer 222c, the opposite electrode 223, and the capping layer 230 are disconnected or separated by the groove G, the disclosure is not limited thereto. In an alternative embodiment, as described above, the second functional layer 222c and/or the capping layer 230 may be omitted, and in such an embodiment, the second functional layer 222c and/or capping layer 230, which are omitted, may not be around the groove G.

In an embodiment, as described with reference to FIGS. 9A and 9B, the first functional layer 222a, the second functional layer 222c, the opposite electrode 223, and the capping layer 230 may be disconnected or separated by the groove G, and the multiple layer ML with the groove G formed therein may have various structures as described below with reference to FIGS. 9C and 9D as well as illustrated in FIGS. 9A to 9B.

Figure 9C:
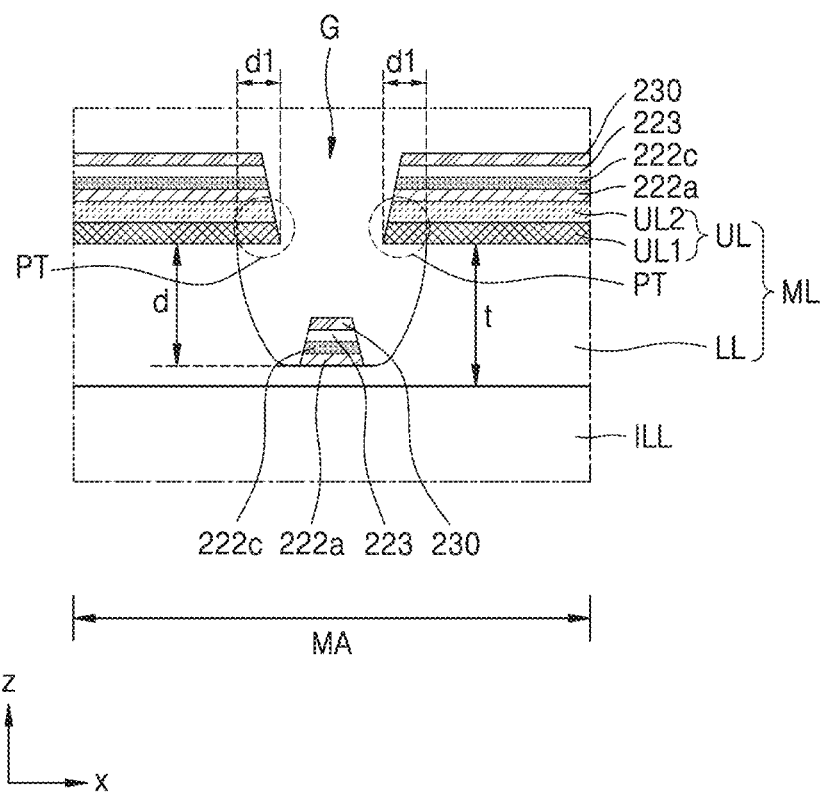

Referring to FIG. 9C, in an alternative embodiment, a groove G may be formed in a multiple layer ML, and an upper layer UL of the multiple layer ML may include a first sub upper layer UL1 and a second sub upper layer UL2 arranged on the first sub upper layer UL1.

In such an embodiment, the upper layer UL may include an inorganic material, where the first sub upper layer UL1 and the second sub upper layer UL2 may include different materials from each other. In one embodiment, for example, the first sub upper layer UL1 may include a conductive oxide such as IZO or may include a metal such as Al, Mo, or Ti, and the second sub upper layer UL2 may include an insulating material such as silicon nitride, silicon oxide, or silicon oxynitride. In such an embodiment, the side surface of the first sub upper layer UL1 facing the groove G may be covered with the second sub upper layer UL2.

In an alternative embodiment, the first sub upper layer UL1 and the second sub upper layer UL2 may include an inorganic material such as silicon nitride, silicon oxide, or silicon oxynitride.

The first sub upper layer UL1 and the second sub upper layer UL2 may extend more toward the center of the groove G than toward the side surface of the lower layer LL to define tips PT. A protrusion length d1 of each tip PT and a depth d of the groove G may be the same as those described above.

Figure 9D:
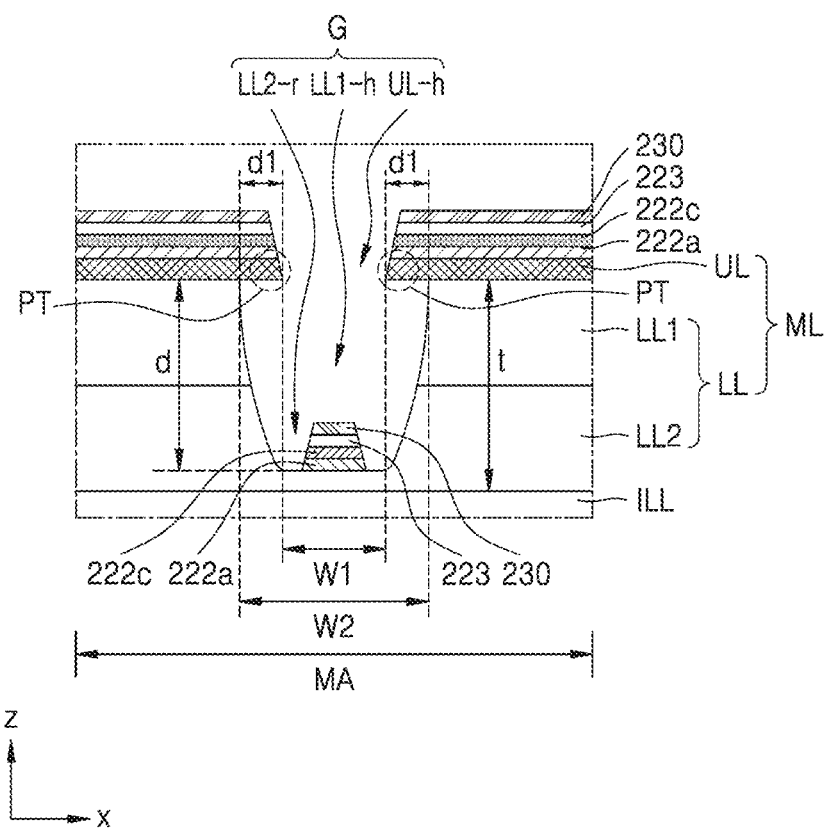

Referring to FIG. 9D, in another alternative embodiment, a groove G may be formed in a multiple layer ML, and a lower layer LL of the multiple layer ML may include a first sub lower layer LL1 and a second sub lower layer LL2. The groove G may include an upper hole UL-h of the upper layer UL, a lower hole LL1-h of the first sub lower layer LL1, and a recess LL2-r of the second sub lower layer LL2. The lower layer LL and the upper layer UL may include different materials from each other. In one embodiment, for example, the first sub lower layer LL1 and the second sub lower layer LL2 may include an organic material such as an organic insulating material, and the upper layer UL may include an inorganic material.

FIGS. 9C and 9D illustrate embodiments where the bottom surface of the groove G is located between the top surface and the bottom surface of the lower layer LL, but not being limited thereto. In an alternative embodiment, the bottom surface of the groove G may be located in a same surface as the bottom surface of the lower layer LL as described with reference to FIG. 9B.

Figure 10:
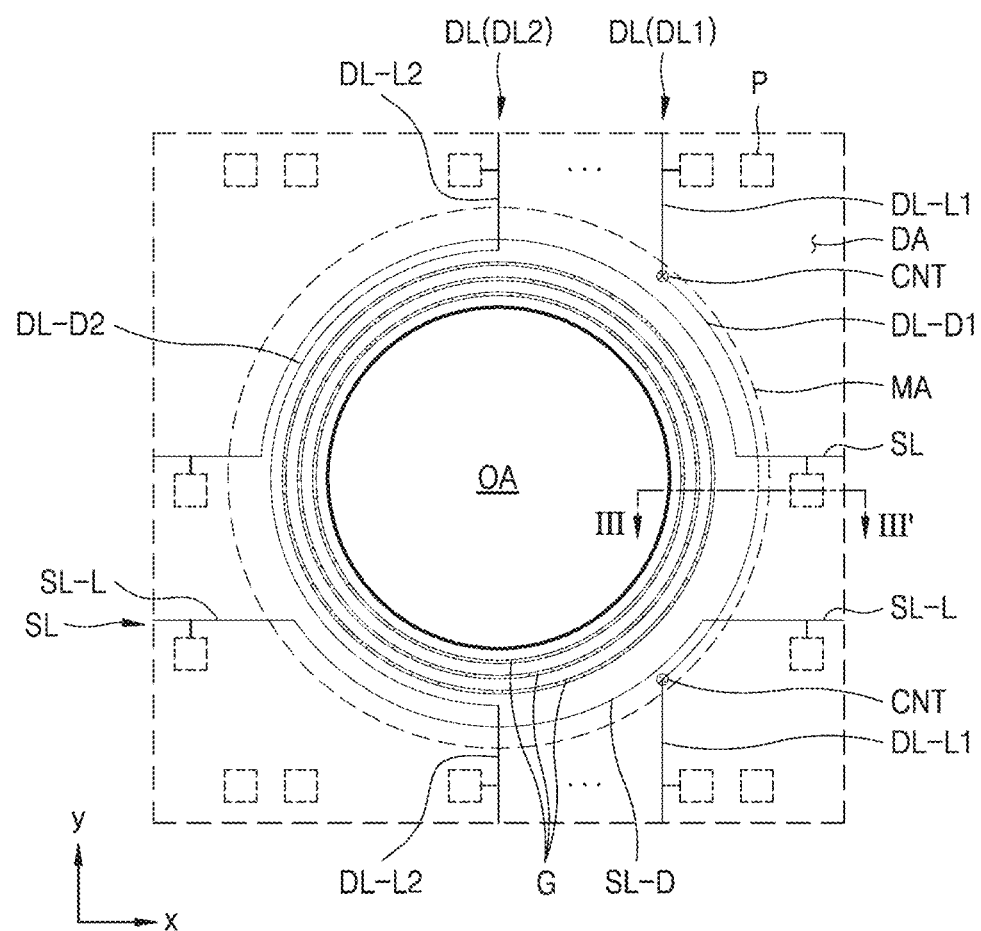
FIG. 10 is a plan view illustrating a portion of a display panel according to an embodiment.

FIG. 10 is a plan view illustrating a portion of a display panel according to an embodiment.

Referring to FIG. 10, in an embodiment of a display panel, the intermediate area MA may be between the first area OA and the display area DA, and a plurality of grooves G may be arranged in the intermediate area MA. In an embodiment, three grooves G may be arranged in the intermediate area MA as illustrated in FIG. 10, but not being limited thereto. Alternatively, the number of the grooves G may be 4 or greater, 6 or greater, 9 or greater, 10 or greater, or 11 or greater, for example.

The signal lines of the display panel may bypass (or detour) the edge of the first area OA in the intermediate area MA. The signal lines connected to the pixels P spaced apart from each other by the first area OA may extend along the edge of the first area OA in the intermediate area MA.

On the plan view of FIG. 10, at least one data line DL may extend in the y direction in the display area DA to provide data signals to the pixels P arranged up and down sides of the first area OA and may extend along the edge of the first area OA in the intermediate area MA. In such an embodiment, at least one scan line SL among the scan lines passing through the display area DA may extend in the x direction in the display area DA to provide scan signals to the pixels P arranged on the left and right sides of the first area OA and may extend along the edge of the first area OA in the intermediate area MA.

A bypass (circuitous) portion SL-D of the scan line SL may be located in a same layer as an extension SL-L crossing the display area DA and may be integrally formed with the extension SL-L as a single unitary unit. A bypass portion DL-D1 of at least one data line (hereinafter referred to as a first data line DL1) among the data lines DL may be located in a different layer from an extension DL-L1 crossing the display area DA, and the extension DL-L1 and the bypass portion DL-D1 of the data line DL may be connected through a contact hole CNT. A bypass portion DL-D2 of at least one data line (hereinafter referred to as a second data line DL2) among the data lines may be located in a same layer as an extension DL-L2 and may be integrally formed with the extension DL-L2 as a single unitary unit.

Figure 11:
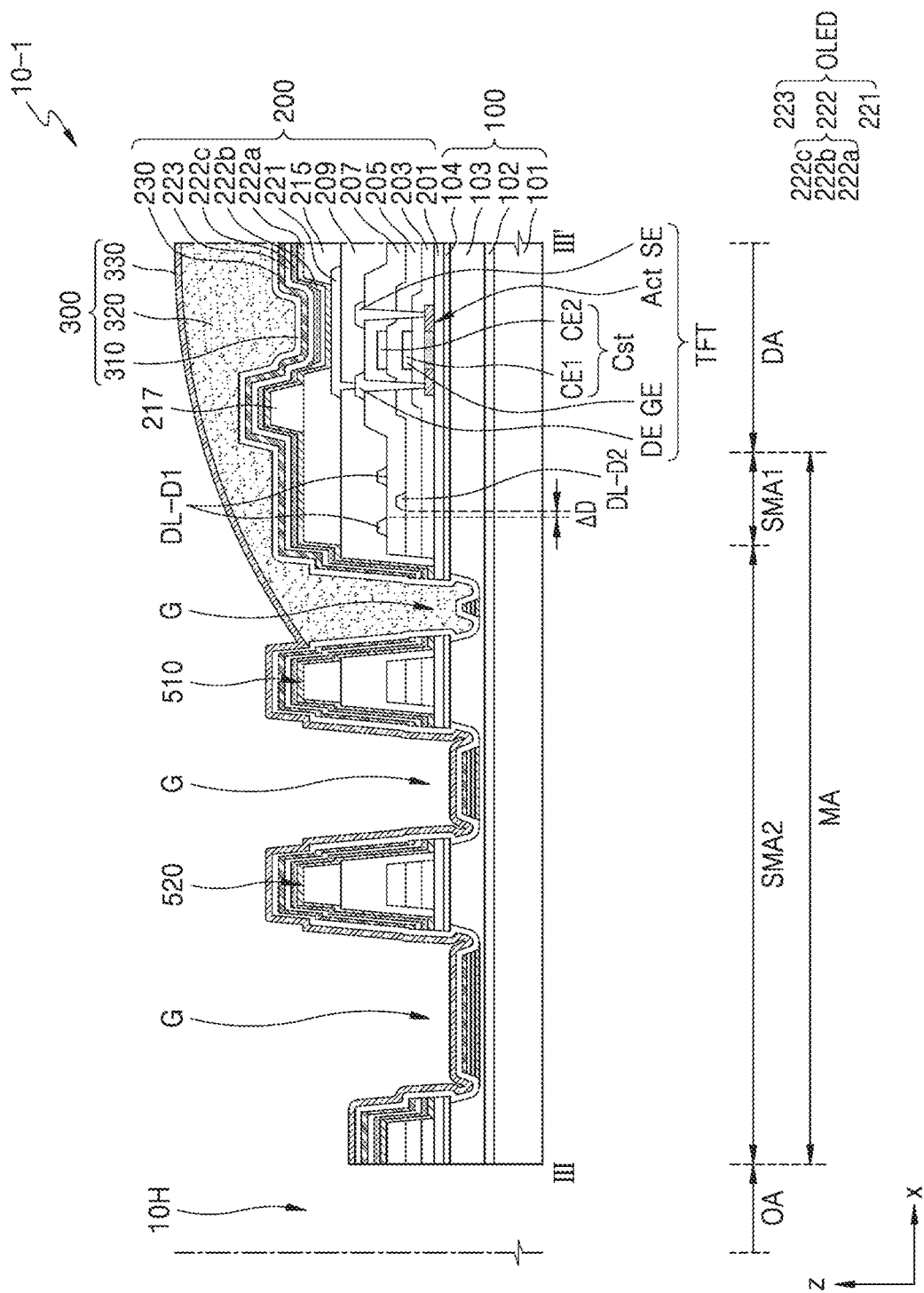
FIG. 11 is a cross-sectional view illustrating a display panel according to an embodiment.
Figure 12:
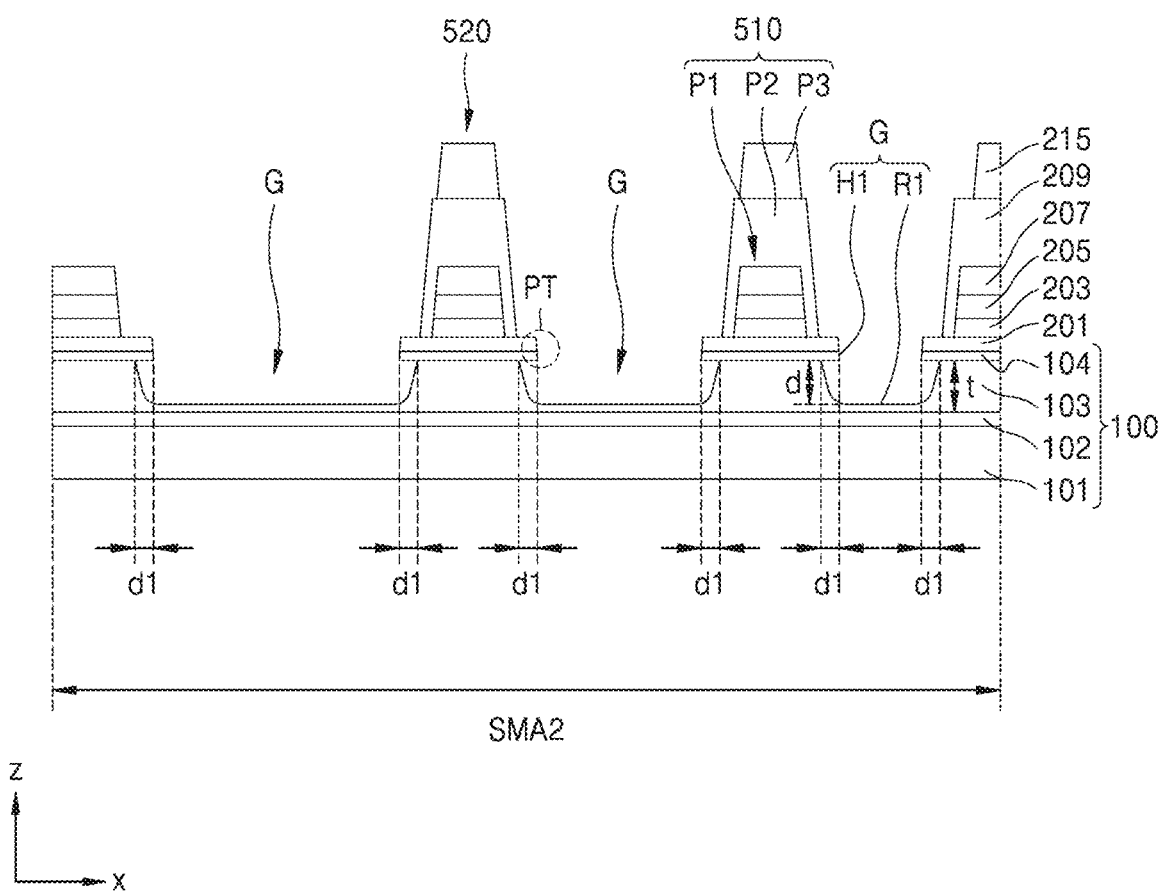
FIG. 12 is a cross-sectional view illustrating grooves in the display panel of FIG. 11.

FIG. 11 is a cross-sectional view illustrating a display panel according to an embodiment. FIG. 12 is a cross-sectional view illustrating grooves in the display panel of FIG. 11. FIGS. 13A to 13G are cross-sectional views illustrating a display panel manufacturing process according to an embodiment, which illustrates a portion of a display area and an intermediate area. FIG. 11 may correspond to a cross-section of the display panel taken along line III-III' of FIG. 10.

Referring to FIG. 11, in an embodiment, an intermediate area MA may be between a first area OA and a display area DA of a display panel 10-1, and an organic light emitting diode OLED and a pixel circuit PC corresponding to each pixel P (see FIG. 10) may be located in the display area DA.

In an embodiment, referring to the display area DA of FIG. 11, a substrate 100 may include a glass material or a polymer resin. In one embodiment, for example, the substrate 100 may include a first base layer 101, a first barrier layer 102, a second base layer 103, and a second barrier layer 104 sequentially stacked one on another as illustrated in FIG. 4E.

A buffer layer 201 may be disposed or formed on the substrate 100 to prevent impurities from penetrating into a semiconductor layer Act of a thin film transistor TFT. The buffer layer 201 may include an inorganic insulating material such as silicon nitride, silicon oxynitride, and silicon oxide and may have a single layer structure or a multi-layer structure, each layer including the inorganic insulating material.

A pixel circuit PC may be arranged on the buffer layer 201. The pixel circuit PC may include a thin film transistor TFT and a capacitor Cst. The thin film transistor TFT and the capacitor Cst may be the first transistor T1 (or a driving thin film transistor) and the capacitor Cst illustrated in FIG. 6.

The thin film transistor TFT may include a semiconductor layer Act, a gate electrode GE, a source electrode SE, and a drain electrode DE. A data line DL of the pixel circuit PC may be electrically connected to a switching thin film transistor (not illustrated) included in the pixel circuit PC. In an embodiment, as shown in FIG. 11, the thin film transistor TFT may be a top gate type transistor in which a gate electrode GE is arranged on the semiconductor layer Act with a gate insulating layer 203 therebetween, but not being limited thereto. According to an alternative embodiment, the thin film transistor TFT may be a bottom gate type transistor.

In an embodiment, the semiconductor layer Act may include a polysilicon. Alternatively, the semiconductor layer Act may include an amorphous silicon, may include an oxide semiconductor, or may include an organic semiconductor or the like. The gate electrode GE may include a low-resistance metal material. The gate electrode GE may include at least one conductive material selected from molybdenum (Mo), aluminum (Al), copper (Cu), titanium (Ti) and the like, and may have a single layer structure or a multi-layer structure, each layer including at least one selected from the above listed materials.

The gate insulating layer 203 between the semiconductor layer Act and the gate electrode GE may include an inorganic insulating material such as silicon oxide, silicon nitride, silicon oxynitride, aluminum oxide, titanium oxide, tantalum oxide, and hafnium oxide. The gate insulating layer 203 may have a single layer structure or a multi-layer structure, each layer including at least one selected from the above listed materials.

The source electrode SE and the drain electrode DE may be located in a same layer as the data line DL and may include a same material as the data line DL. The source electrode SE, the drain electrode DE, and the data line DL may include a material having high conductivity. The source electrode SE and the drain electrode DE may include at least one conductive material selected from molybdenum (Mo), aluminum (Al), copper (Cu), titanium (Ti) and the like, and may have a single layer structure or a multi-layer structure, each layer including at least one selected from the above listed materials. In an embodiment, the source electrode SE, the drain electrode DE, and the data line DL may include a multiple layer of Ti/Al/Ti.

The capacitor Cst may include a lower electrode CE1 and an upper electrode CE2 overlapping each other with a first interlayer insulating layer 205 therebetween. The capacitor Cst may overlap the thin film transistor TFT. In an embodiment, as shown in FIG. 11, the gate electrode GE of the thin film transistor TFT is the lower electrode CE1 of the capacitor Cst. In an alternative embodiment, the capacitor Cst may not overlap the thin film transistor TFT. The capacitor Cst may be covered by a second interlayer insulating layer 207. The upper electrode CE2 of the capacitor Cst may include at least one conductive material selected from molybdenum (Mo), aluminum (Al), copper (Cu), titanium (Ti) and the like, and may have a single layer structure or a multi-layer structure, each layer including at least one selected from the above listed materials.

The first interlayer insulating layer 205 and the second interlayer insulating layer 207 may include an inorganic insulating material such as silicon oxide, silicon nitride, silicon oxynitride, aluminum oxide, titanium oxide, tantalum oxide, or hafnium oxide. The first interlayer insulating layer 205 and the second interlayer insulating layer 207 may have a single layer structure or a multi-layer structure, each layer including at least one selected from the above listed materials.

The pixel circuit PC including the thin film transistor TFT and the capacitor Cst may be covered by a first organic insulating layer 209. The first organic insulating layer 209 may have a substantially flat top surface. The pixel circuit PC may be electrically connected to a pixel electrode 221.

The first organic insulating layer 209 may include an organic insulating material such as a general-purpose polymer such as PMMA or PS, a polymer derivative having a phenolic group, an acrylic polymer, an imide-based polymer, an arylether-based polymer, an amide-based polymer, a fluorine-based polymers, a p-xylene-based polymer, a vinyl alcohol-based polymer, or a combination (e.g., a blend) thereof. In an embodiment, the first organic insulating layer 209 may include polyimide.

The pixel electrode 221 may be disposed or formed on the first organic insulating layer 209. The first organic insulating layer 209 may correspond to the planarization layer described above with reference to FIG. 8. The edge of the pixel electrode 221 may be covered with a pixel definition layer 215. An opening is defined through the pixel definition layer 215 to overlap a portion of the pixel electrode 221. A spacer 217 may be located on the pixel definition layer 215. The spacer 217 may include a different material from the pixel definition layer 215 or may include a same material as the pixel definition layer 215. In an embodiment, the pixel definition layer 215 and the spacer 217 may include a same material as each other and may be formed together in a same mask process using a halftone mask. In an embodiment, the pixel definition layer 215 and the spacer 217 may include polyimide.

An intermediate layer 222 may include an emission layer 222b. The intermediate layer 222 may include a first functional layer 222a arranged under the emission layer 222b and/or a second functional layer 222c arranged on the emission layer 222b. The emission layer 222b may include a high-molecular or low-molecular weight organic material for emitting light of a certain color. An opposite electrode 223 may be arranged on the intermediate layer 222, and a capping layer 230 may be arranged on the opposite electrode 223. Alternatively, the capping layer 230 may be omitted.

The materials, structures, and characteristics of the pixel electrode 221, the intermediate layer 222, and the opposite electrode 223 may be the same as those described above with reference to FIG. 8, and any repetitive detailed description thereof will be omitted.

The organic light emitting diode OLED may be covered by a thin film encapsulation layer 300. The thin film encapsulation layer 300 may include at least one organic encapsulation layer and at least one inorganic encapsulation layer. In an embodiment, as shown in FIG. 11, the thin film encapsulation layer 300 includes first and second inorganic encapsulation layers 310 and 330 and an organic encapsulation layer 320 arranged therebetween. In such an embodiment, the number of the organic encapsulation layers, the number of the inorganic encapsulation layers, and the stacking order thereof may be variously modified.

The first inorganic encapsulation layer 310 and the second inorganic encapsulation layer 330 may include one or more inorganic materials such as aluminum oxide, titanium oxide, tantalum oxide, hafnium oxide, zinc oxide, silicon oxide, silicon nitride, or silicon oxynitride. The first inorganic encapsulation layer 310 and the second inorganic encapsulation layer 330 may have a single layer structure or a multi-layer structure, each layer including at least one selected from the above listed materials. The organic encapsulation layer 320 may include a polymer-based material. The polymer-based material may include acrylic resin, epoxy resin, polyimide, polyethylene, or the like. In one embodiment, for example, the organic encapsulation layer 320 may include acrylate.

The first inorganic encapsulation layer 310 and the second inorganic encapsulation layer 330 may have different thicknesses from each other. The thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the first inorganic encapsulation layer 310 and the second inorganic encapsulation layer 330 may have a same thickness as each other.

Referring to the intermediate area MA of FIG. 11, the intermediate area MA may include a first sub intermediate area SMA1 relatively distant from the first area OA and a second sub intermediate area SMA2 relatively close to the first area OA.

Lines, for example, signal lines, may be located in the first sub intermediate area SMA1. Bypass portions (e.g., DL-D1 and DL-D2) of the first and second data lines DL1 and DL2 described above with reference to FIG. 10 may be located in the first sub intermediate area SMA1 of FIG. 11. In an embodiment, the first sub intermediate area SMA1 may be a line area or a bypass area bypassed by the data lines DL as described above. The data lines DL located in the intermediate area MA described with reference to FIG. 10 may include first data lines DL1 and second data lines DL2 alternately arranged above and below the second interlayer insulating layer 207 with the second interlayer insulating layer 207 therebetween. In an embodiment, as shown in FIG. 11, the bypass portion DL-D1 of the first data line DL1 and the bypass portion DL-D2 of the second data line DL2 are arranged adjacent to each other and are respectively arranged above or below the second interlayer insulating layer 207. In such an embodiment, a gap (or pitch) ΔD between the adjacent first data line DL1 and second data line DL2 in the x direction, for example, between the bypass portion DL-D1 of the first data line DL1 and the bypass portion DL-D2 of the second data line DL2, may be reduced.

Grooves G may be located in the second sub intermediate area SMA2. The grooves G may be formed in a multiple layer ML, and in an embodiment, as illustrated in FIG. 11, the multiple layer ML may include a sublayer disposed on the substrate 100. In one embodiment, for example, the multiple layer ML may include a buffer layer 201, a second barrier layer 104, and a second base layer 103. The second barrier layer 104 and the buffer layer 201 may correspond to the first sub upper layer and the second sub upper layer of the multiple layer ML described with reference to FIG. 9C, and the second base layer 103 corresponds to the lower layer thereof. Herein, although the buffer layer 201 and the second barrier layer 104 are described as separate elements, the buffer layer 201 of the substrate 100 may be a sublayer of the second barrier layer 104 having a multi-layer structure.

In an embodiment, as illustrated in FIG. 12, the groove G may include a hole H1 defined through the buffer layer 201 and the second barrier layer 104 and a recess R1 of the second base layer 103. In such an embodiment, the bottom surface of the groove G may be between the top surface and the bottom surface of the second base layer 103. In an alternative embodiments, the second base layer 103 may include a hole defined through the second base layer 103, instead of the recess R1.

The groove G may have an undercut cross-section. A tip PT of the groove G may have a certain length d1, and the features regarding the length d1 of the tip PT may be the same as those described above with reference to FIG. 9A. In one embodiment, for example, the length d1 of the tip PT may be less than about 2.0 µm.

In an embodiment, a depth d of the groove G may be less than a thickness t of the second base layer 103 as illustrated in FIG. 12. Alternatively, the depth d of the groove G may be equal to the thickness t of the second base layer 103, and the features regarding the depth d are the same as those described above with reference to FIGS. 9A and 9B.

Partitions, for example, first and second partitions 510 and 520, may be located in the intermediate area MA. The first and second partitions 510 and 520 may be between adjacent grooves G. The first and second partitions 510 and 520 may be formed by sequentially stacking a portion P1 of the layers forming the gate insulating layer 203, the first interlayer insulating layer 205, and the second interlayer insulating layer 207 and portions P2 and P3 of at least two layers among the layer forming the first organic insulating layer 209, the layer forming the pixel definition layer 215, and the layer forming the spacer 217. The height from the top surface of the substrate 100 to the top surfaces of the first and second partitions 510 and 520 may be lower than the height from the top surface of the substrate 100 to the top surface of the spacer 217.

The grooves G may be formed before a process of forming the intermediate layer 222, and the first functional layer 222a, the second functional layer 222c, the opposite electrode 223 and the capping layer 230 may be disconnected or separated by the grooves G as illustrated in FIG. 11 as described above.

The widths of the grooves G may be different from each other. FIG. 11 illustrates an embodiment where the width of the groove G relatively close to the first area OA is greater than the width of the groove G relatively distant from the first area OA, but not being limited thereto. In an alternative embodiment, the widths of the grooves G may be equal to each other.

The first inorganic encapsulation layer 310 may be formed by a chemical vapor deposition or the like, and the first inorganic encapsulation layer 310 may have a relatively high step coverage unlike the first functional layer 222a, the second functional layer 222c, the opposite electrode 223 and the capping layer 230. Thus, the first inorganic encapsulation layer 310 may continuously cover the inner surfaces of the grooves G without being disconnected around the grooves G.

The first inorganic encapsulation layer 310 may entirely cover the display area DA and the intermediate area MA. In the intermediate area MA, the first inorganic encapsulation layer 310 may entirely and continuously cover the inner surfaces of the grooves G. A stack of the first and second functional layers 222a and 222c, the opposite electrode 223, and the capping layer 230 disconnected around the tip PT may be arranged on the bottom surface of the groove G, and the first inorganic encapsulation layer 310 may cover the stack described above.

The first inorganic encapsulation layer 310 may have a single layer structure or may include a plurality of sublayers. In one embodiment, for example, the first inorganic encapsulation layer 310 may include two layers of silicon oxynitride having different layer qualities from each other, and in such an embodiment, the capping layer 230 may be omitted. Alternatively, the first inorganic encapsulation layer 310 may include silicon oxynitride and silicon oxide, may include silicon oxynitride and silicon nitride, or may include silicon nitride and silicon oxynitride.

The organic encapsulation layer 320 may cover a portion of the display area DA and the intermediate area MA. An end portion of the organic encapsulation layer 320 adjacent to the first area OA may be arranged adjacent to one side of the first partition 510. The organic encapsulation layer 320 may fill any one of the grooves G. In one embodiment, for example, a space on the first inorganic encapsulation layer 310 of the groove G located between the display area DA and the first partition 510 may be filled with the organic encapsulation layer 320.

In an embodiment, the second inorganic encapsulation layer 330 may entirely and continuously cover the inner surface of the groove G, similarly to the first inorganic encapsulation layer 310. A portion of the second inorganic encapsulation layer 330 may directly contact the first inorganic encapsulation layer 310 in the second sub intermediate area SMA2. The second inorganic encapsulation layer 330 may directly contact the first inorganic encapsulation layer 310 on at least one groove G among a plurality of grooves G. The first and second inorganic encapsulation layers 310 and 330 may also contact each other on the top surfaces of the first and second partitions 510 and 520.

The structure illustrated in FIG. 11 may be a cross-section of a structure surrounding the first area OA on the plan view. In one embodiment, for example, as illustrated in FIG. 10, the grooves G of FIG. 11 may have a ring shape surrounding the first area OA when viewed in a direction perpendicular to the top surface of the substrate 100, that is, the z direction. Similarly, the first and second partitions 510 and 520 may also have a ring shape surrounding the first area OA when viewed in the direction perpendicular to the top surface of the substrate 100.

Hereinafter, an embodiment of a process of forming an undercut groove G will be described with reference to FIGS. 13A to 13G.

Figure 13A:
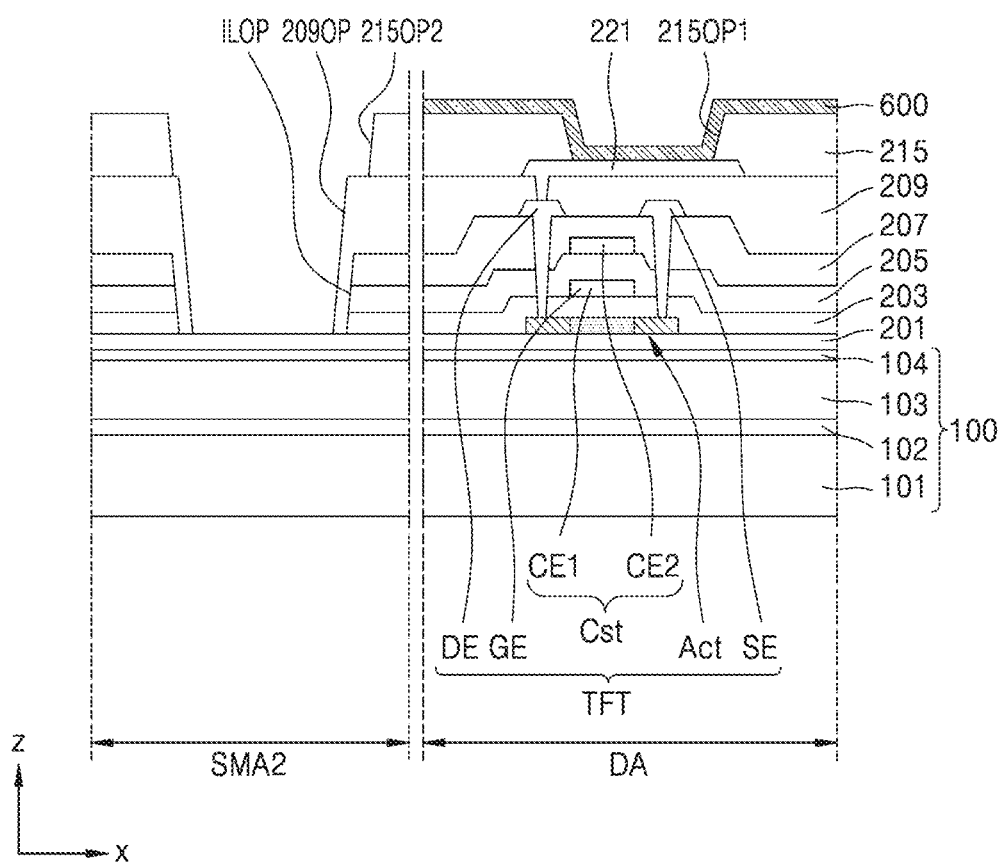
FIGS. 13A to 13H are cross-sectional views illustrating a display panel manufacturing process according to an embodiment.

Referring to FIG. 13A, a thin film transistor TFT constituting a pixel circuit and a pixel electrode 221 may be provided or formed on a substrate 100 in a display area DA.

An opening ILOP of an inorganic insulating layer including a gate insulating layer 203, a first interlayer insulating layer 205, and a second interlayer insulating layer 207 and an opening 209OP of a first organic insulating layer 209 may be formed in an area (hereinafter referred to as a 'groove area') where a groove G of a second sub intermediate area SMA2 is to be formed.

An opening ILOP of the inorganic insulating layer may be formed together in a groove area in the process of forming contact holes in the gate insulating layer 203, the first interlayer insulating layer 205 and the second interlayer insulating layer 207, through which a source electrode SE and a drain electrode DE is connected to a semiconductor layer Act in the display area DA. The opening ILOP of the inorganic insulating layer may be covered by the first organic insulating layer 209. An opening 209OP of the first organic insulating layer 209 may be formed together in a groove area in the process of forming a contact hole for connecting a pixel electrode 221 and a source electrode SE or a drain electrode DE in the display area DA.

A pixel definition layer 215 may be provided or formed to cover the opening 209OP of the first organic insulating layer 209 and the pixel electrode 221. An opening 215OP1 for exposing a portion of the pixel electrode 221 may be formed in the pixel definition layer 215 in the display area DA, and simultaneously, an opening 215OP2 may be formed in the groove area of the second sub intermediate area SMA2. Accordingly, the opening 215OP1 defined in the display area DA and the opening 215OP2 defined in the second sub intermediate area SMA2 may be formed in the pixel definition layer 215.

A protection layer 600 may be provided or formed on the pixel electrode 221. The protection layer 600 may be a pattern covering at least an emission area. The protection layer 600 may include an organic material that may be easily removed while minimizing damage to the pixel electrode 221. In an embodiment, the protection layer 600 may include a photosensitive material of a positive photoresist or a negative photoresist. FIG. 13A illustrates an embodiment in which the protection layer 600 is a photoresist pattern covering at least an emission area.

Figure 13B:
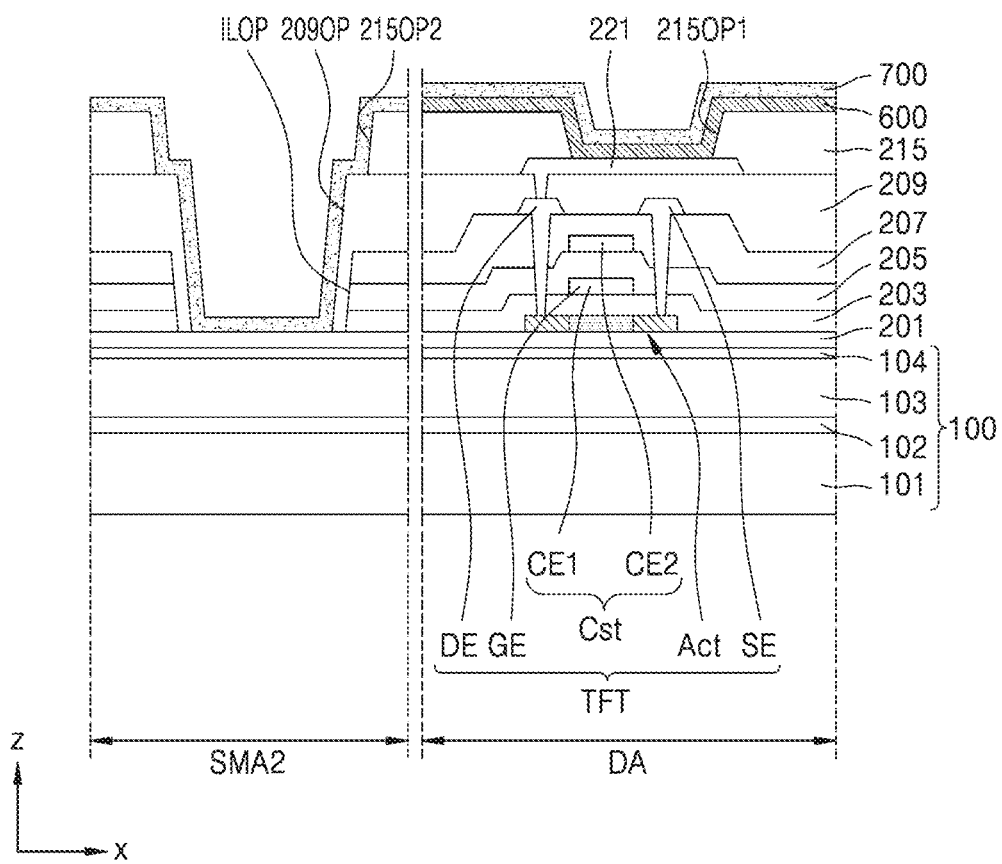

Referring to FIG. 13B, a mask layer 700 may be provided or formed over the substrate 100 where the protection layer 600 has been formed. The mask layer 700 may be continuously formed in the display area DA and the intermediate area MA and may cover the protection layer 600 and the openings 209OP and 215OP2 of the groove area. The mask layer 700 may cover the side surfaces and bottom surfaces of the openings 209OP and 215OP2 of the groove area.

The mask layer 700 may include a conductive oxide such as IZO, ITO, ZnO, $In_2O_3$, IGO, and/or AZO, may include a metal such as Mo, Cu, and/or Ti, or may include an insulating material such as silicon nitride, silicon oxide, and/or silicon oxynitride.

Figure 13C:
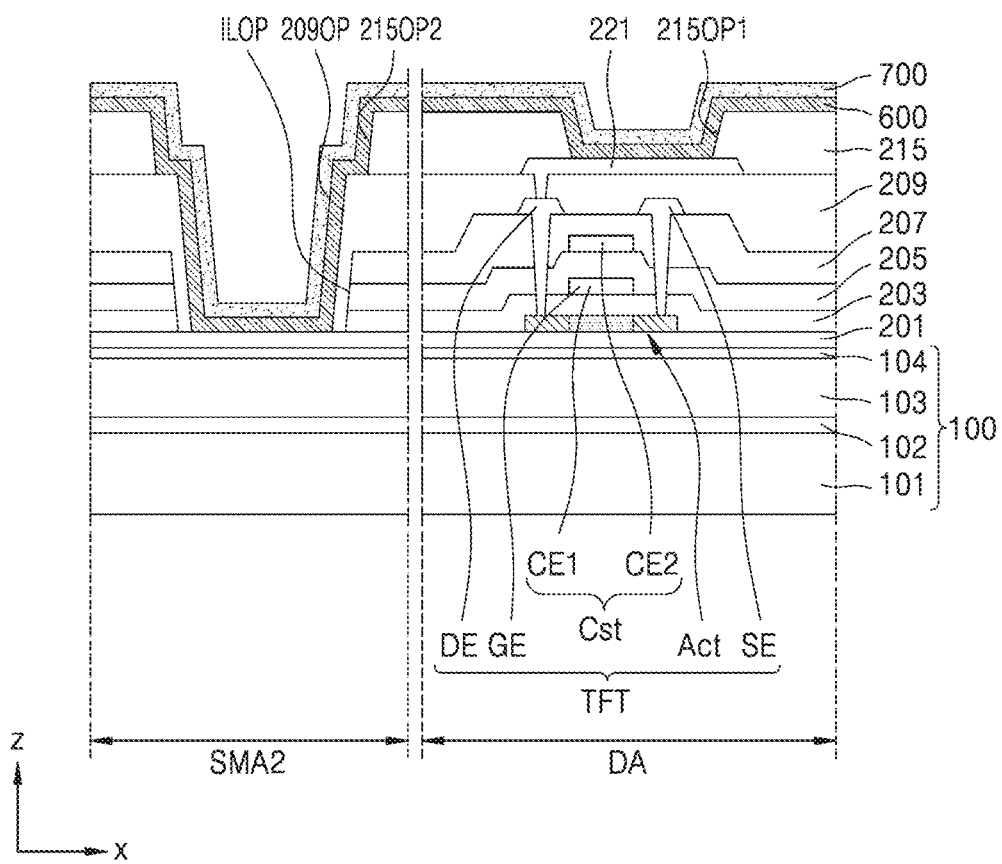

FIGS. 13A and 13B illustrate an embodiment in which the protection layer 600 is a pattern covering the pixel electrode 221 and the periphery of the pixel electrode 221. In an alternative embodiment, as illustrated in FIG. 13C, the protection layer 600 and the mask layer 700 may be continuously formed in the display area DA and the intermediate area MA and may be formed to cover the openings 209OP and 215OP of the groove area. In such an embodiment illustrated in FIG. 13C, a process of patterning the protection layer 600 in a pattern corresponding to the emission area may be omitted.

Figure 13D:
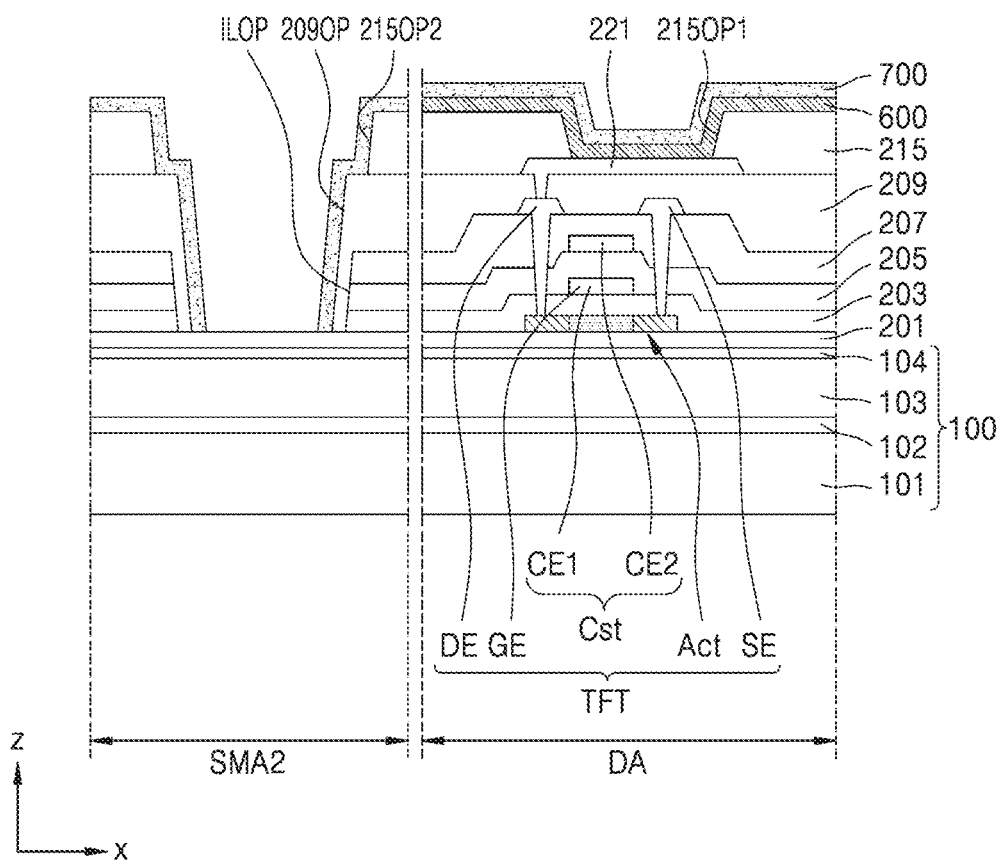

In an embodiment, as illustrated in FIG. 13D, a portion of the mask layer 700 in the groove area may be removed by a photo process. After a photoresist pattern is formed on the mask layer 700, a portion of the mask layer 700 on the bottom surface of the opening 215OP2 may be removed by etching the mask layer 700 of the groove area by using the photoresist pattern as an etch mask. In an embodiment, the etching process may be a wet etching. Accordingly, the top surface of the buffer layer 201, that is, the lower layer of the opening 215OP2 in the groove area, may be exposed. The photoresist pattern remaining on the mask layer 700 after the etching process may be removed by an ashing or stripping process.

Figure 13E:
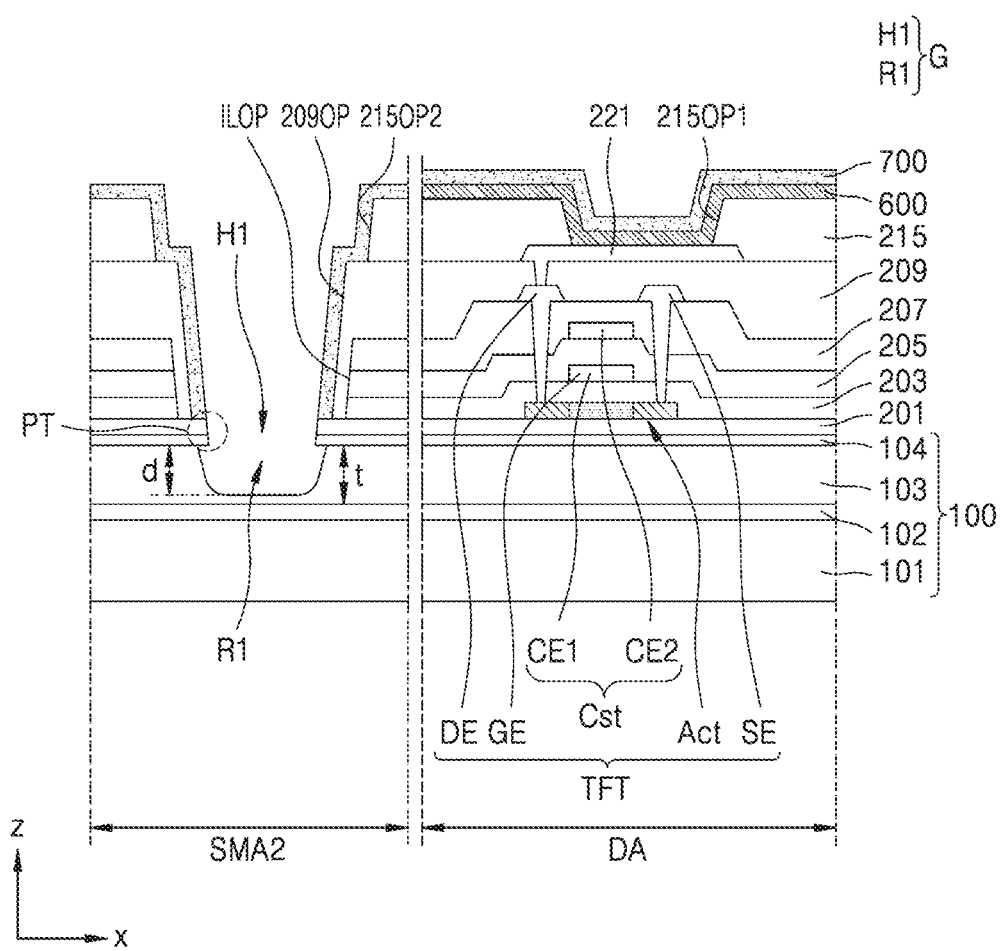

In such an embodiment, as illustrated in FIG. 13E, a groove G may be formed by removing the lower layer of the opening 215OP2 exposed in the groove area. In the groove area, a hole H1 may be formed through the buffer layer 201 and the second barrier layer 104 by etching the buffer layer 201 and the second barrier layer 104 from which the mask layer 700 has been removed, and a recess R1 may be formed in the second base layer 103 by etching the second base layer 103. In an embodiment, the etching process may be a dry etching.

The recess R1 and the hole H1 may be spatially connected to form a groove G, and the groove G may have an undercut cross-section. In FIG. 13E, a multiple layer where the groove G has been formed may include an upper layer including the buffer layer 201 and the second barrier layer 104, and a lower layer of the second base layer 103. The buffer layer 201 may be a portion of the multi-layer structure of the second barrier layer 104. An end portion of the buffer layer 201 and the second barrier layer 104 surrounding the groove G may have a tip PT with a certain length. FIG. 13E illustrates an embodiment in which the groove G includes the recess R1 of the second base layer 103 and the depth d of the groove G is smaller than the thickness t of the second base layer 103. In an alternative embodiment, as illustrated in FIG. 9B, the groove G may include a hole formed through the second base layer 103, and the depth d of the groove G may be equal to the thickness t of the second base layer 103.

Figure 13F:
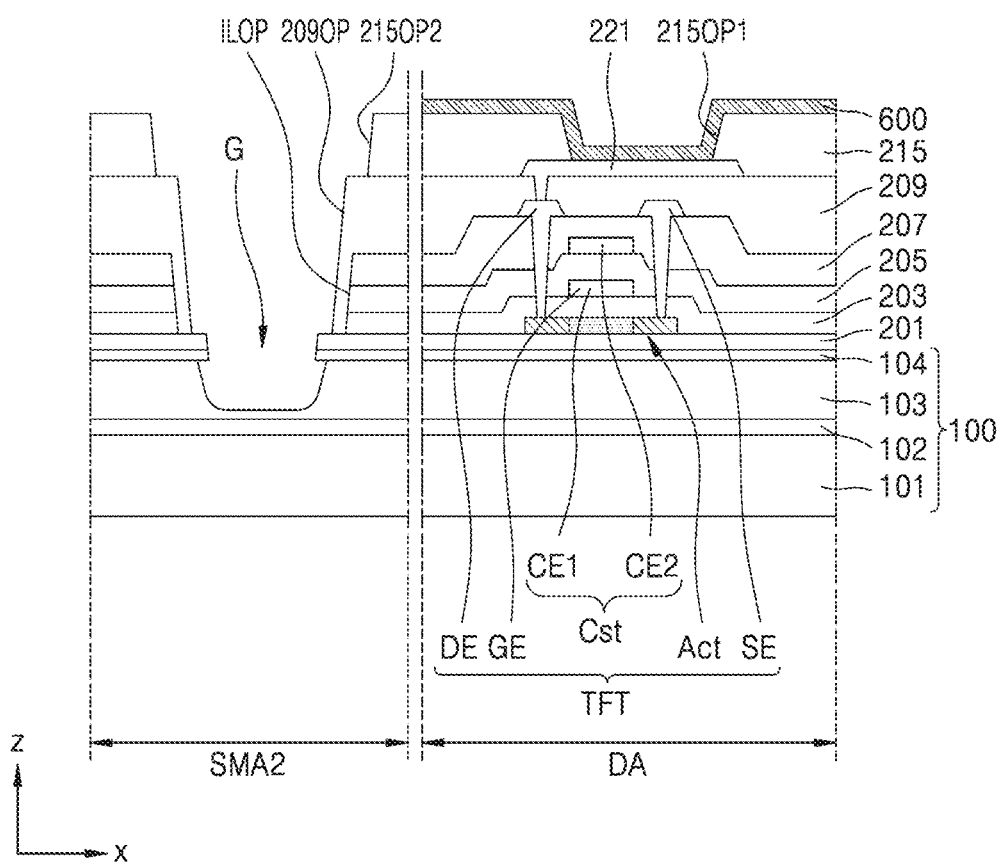

Subsequently, as illustrated in FIG. 13F, the mask layer 700 remaining over the substrate 100 may be etched and removed. In an embodiment, the etching process may be a wet etching. Because the protection layer 600 is arranged on the pixel electrode 221, the pixel electrode 221 may be protected in a wet etching process for removing the mask layer 700.

If the mask layer 700 is formed directly on the pixel electrode 221 without the protection layer 600, the pixel electrode 221 may be damaged by a wet etching in the process of removing the mask layer 700 when the groove G is formed, and then the mask layer 700 is removed.

According to an embodiment, the protection layer 600 is formed between the pixel electrode 221 and the mask layer 700, such that the pixel electrode 221 may be protected by the protection layer 600 in the process of removing the mask layer 700 after forming the groove G.

Figure 13G:
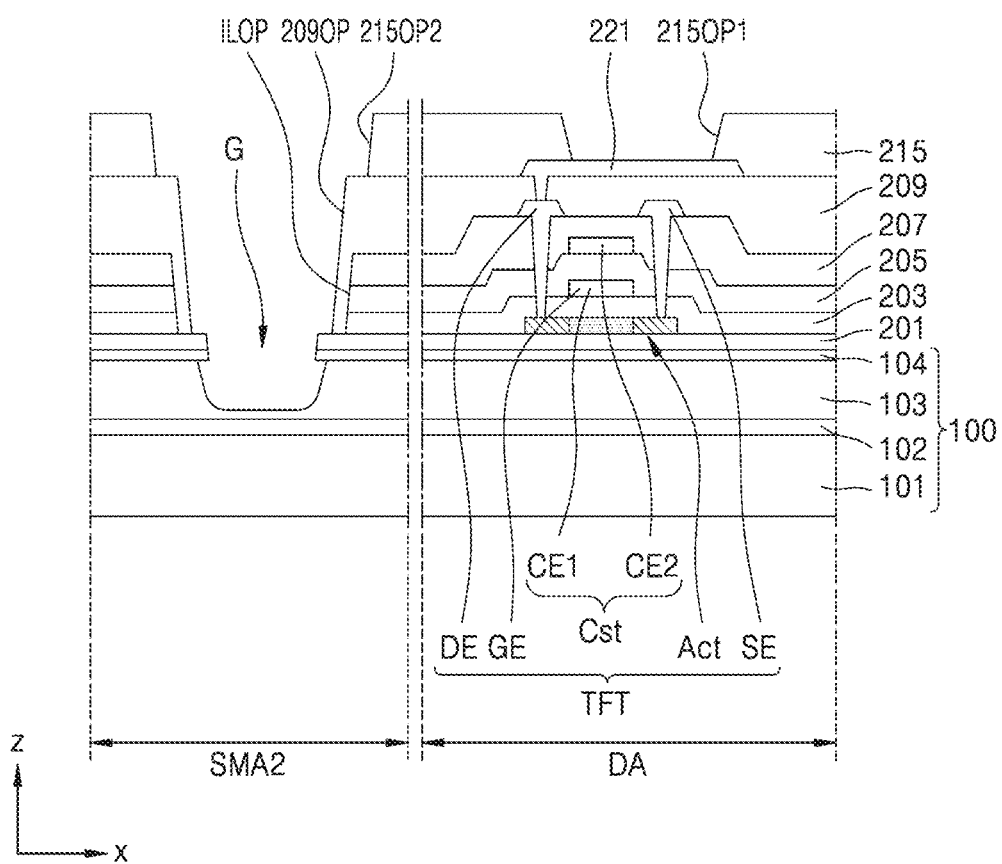

Next, as illustrated in FIG. 13G, the protection layer 600 remaining over the substrate 100 may be removed. In an embodiment where the protection layer 600 includes photoresist, the protection layer 600 may be removed by an ashing or stripping process.

If the mask layer 700 is formed directly on the pixel electrode 221 without the protection layer 600, particles generated in the wet etching process may flow into and remain on the pixel electrode 221 when the groove G is formed, and then the mask layer 700 is removed. Such particles may act as a short path between the pixel electrode 221 and the opposite electrode 223, thus causing a defect such as a dark pixel.

According to an embodiment, in the process of removing the protection layer 600, particles generated in the process of removing the mask layer 700 and introduced onto the pixel electrode 221 may be removed, thus preventing a pixel defect.

Figure 13H:
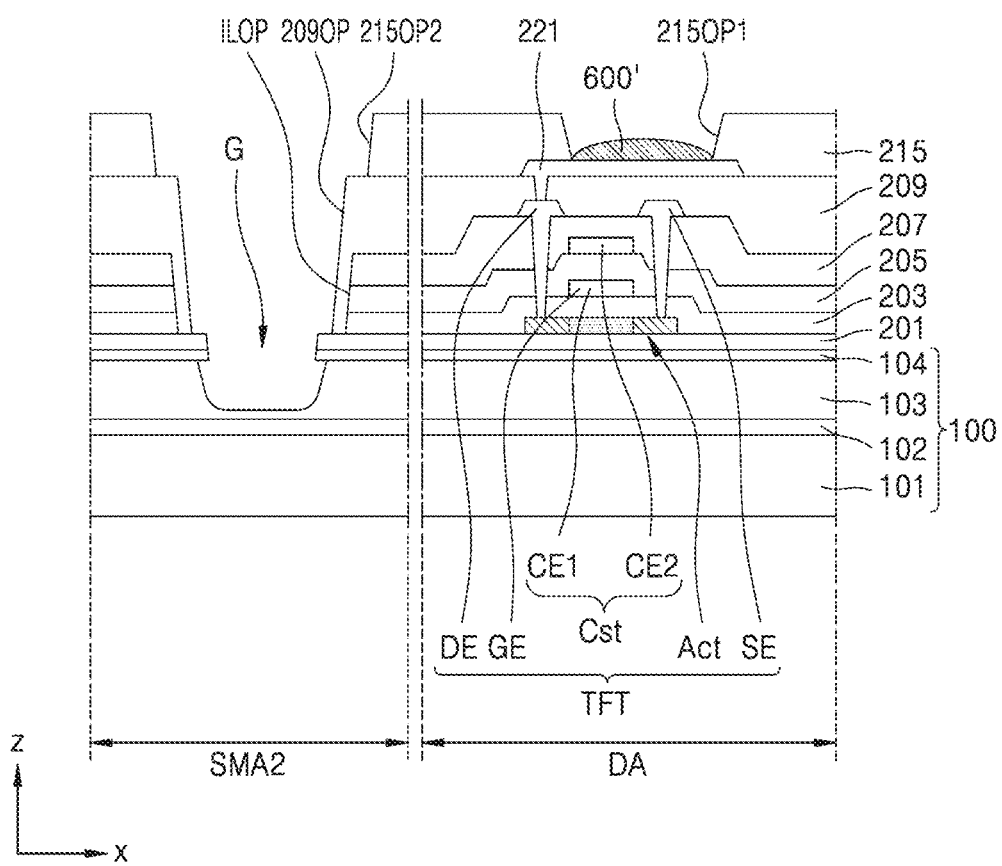

FIGS. 13A to 13G illustrate an embodiment in which the protection layer 600 is a photoresist, but not being limited thereto. In an alternative embodiment, as illustrated in FIG. 13H, a protection layer 600' may be formed by applying ink onto the pixel electrode 221 through an inkjet process. In such an embodiment, the ink may also include an organic material that may be easily removed while minimizing damage to the pixel electrode 221. A process of forming a mask layer 700 after forming the protection layer 600' and a process of removing the protection layer 600' may be the same as those described above in FIGS. 13B to 13G.

Figure 14:
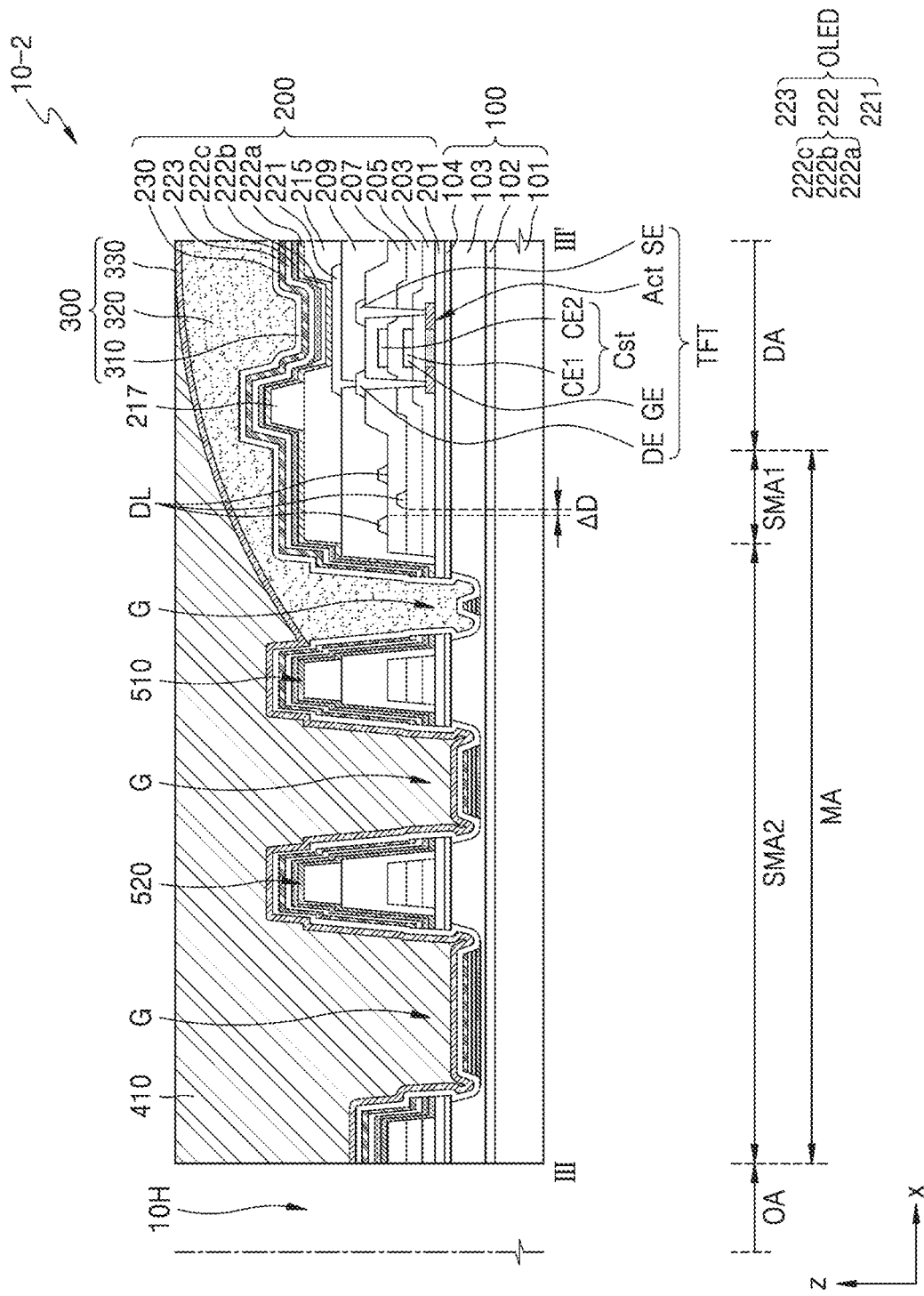
FIG. 14 is a cross-sectional view of a display panel according to an alternative embodiment.

FIG. 14 is a cross-sectional view of a display panel according to an alternative embodiment.

A display panel 10-2 illustrated in FIG. 14 is substantially the same as the display panel 10-1 described with reference to FIG. 11 except that the display panel 10-2 further includes a planarization layer 410. The same or like elements shown in FIG. 14 have been labeled with the same reference characters as used above to describe the embodiments of the display panel shown in FIG. 11, and any repetitive detailed description thereof will hereinafter be omitted or simplified.

In such an embodiment, the planarization layer 410 may be an organic insulating layer. The planarization layer 410 may include a polymer-based material. In one embodiment, for example, the planarization layer 410 may include silicon-based resin, acryl-based resin, epoxy-based resin, polyimide, and/or polyethylene. In an embodiment, the planarization layer 410 may include a different material from the organic encapsulation layer 320.

The planarization layer 410 may improve the flatness of the display panel 10-2 by covering an area in which the organic encapsulation layer 320 does not exist in the second sub intermediate area SMA2. Thus, the input sensing layer or the optical functional layer or the like formed directly on the display panel 10-2 or coupled by the adhesive layer may be prevented from being separated or detached from the display panel 10-2.

Figure 15:
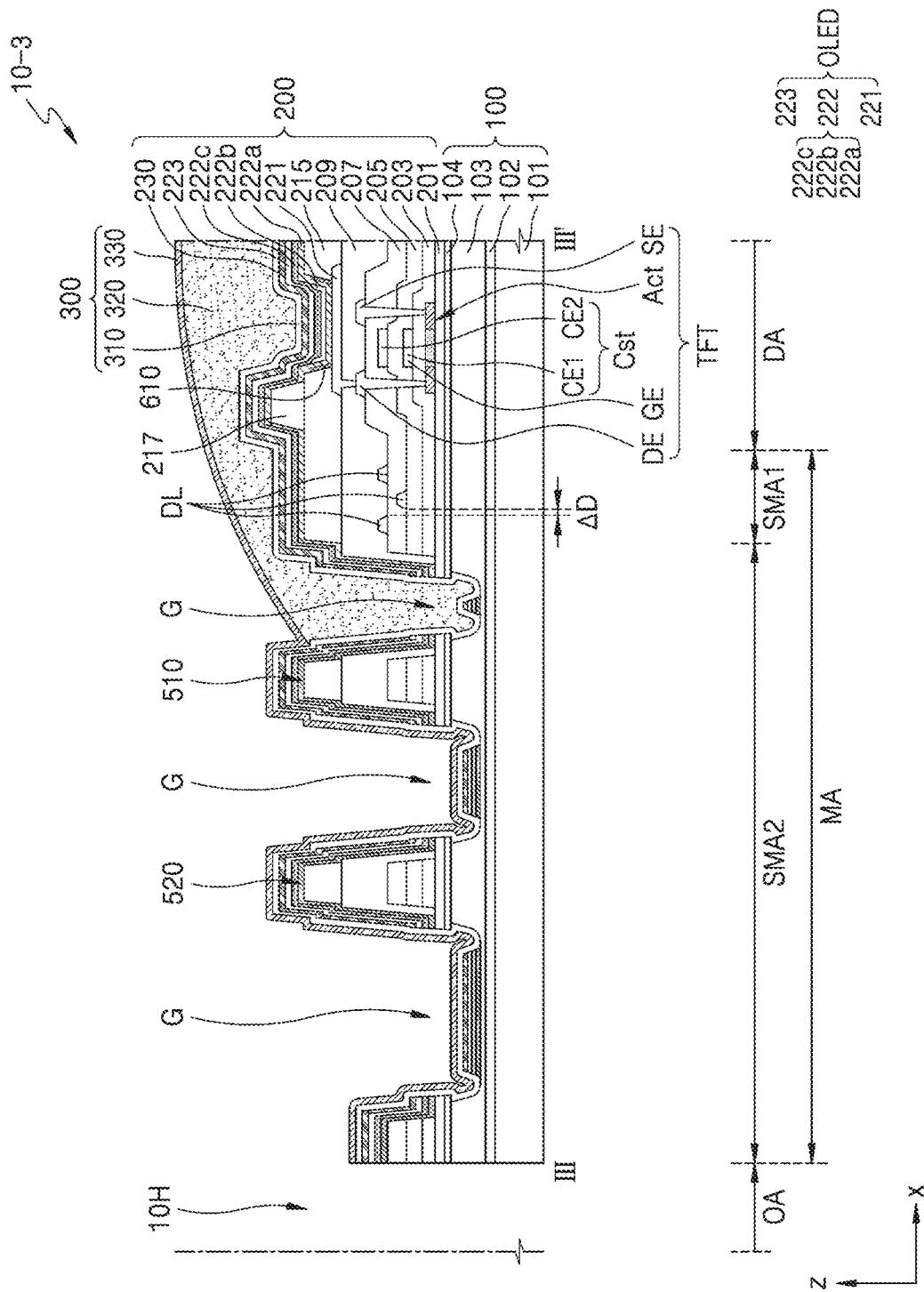
FIG. 15 is a cross-sectional view of a display panel according to another alternative embodiment.

FIG. 15 is a cross-sectional view of a display panel according to another alternative embodiment.

In an embodiment of a display panel 10-3, as illustrated in FIG. 15, an organic material 610 may be disposed at a side surface of a pixel definition layer 215 surrounding the edge of a pixel electrode 221. In such an embodiment, other configurations of the display panel 10-3 may be the same as those described in FIG. 11. The organic material 610 may be a remainder of the protection layers 600 or 600' removed after being formed on the pixel electrode 221 to form the groove G, as illustrated in FIG. 13A or 13H.

The protection layer 600 or 600' may be completely removed as described with reference to FIG. 13G, but a portion thereof may remain on the side surface of the pixel definition layer 215 within a range not affecting the organic light emitting diode OLED.

Figure 16:
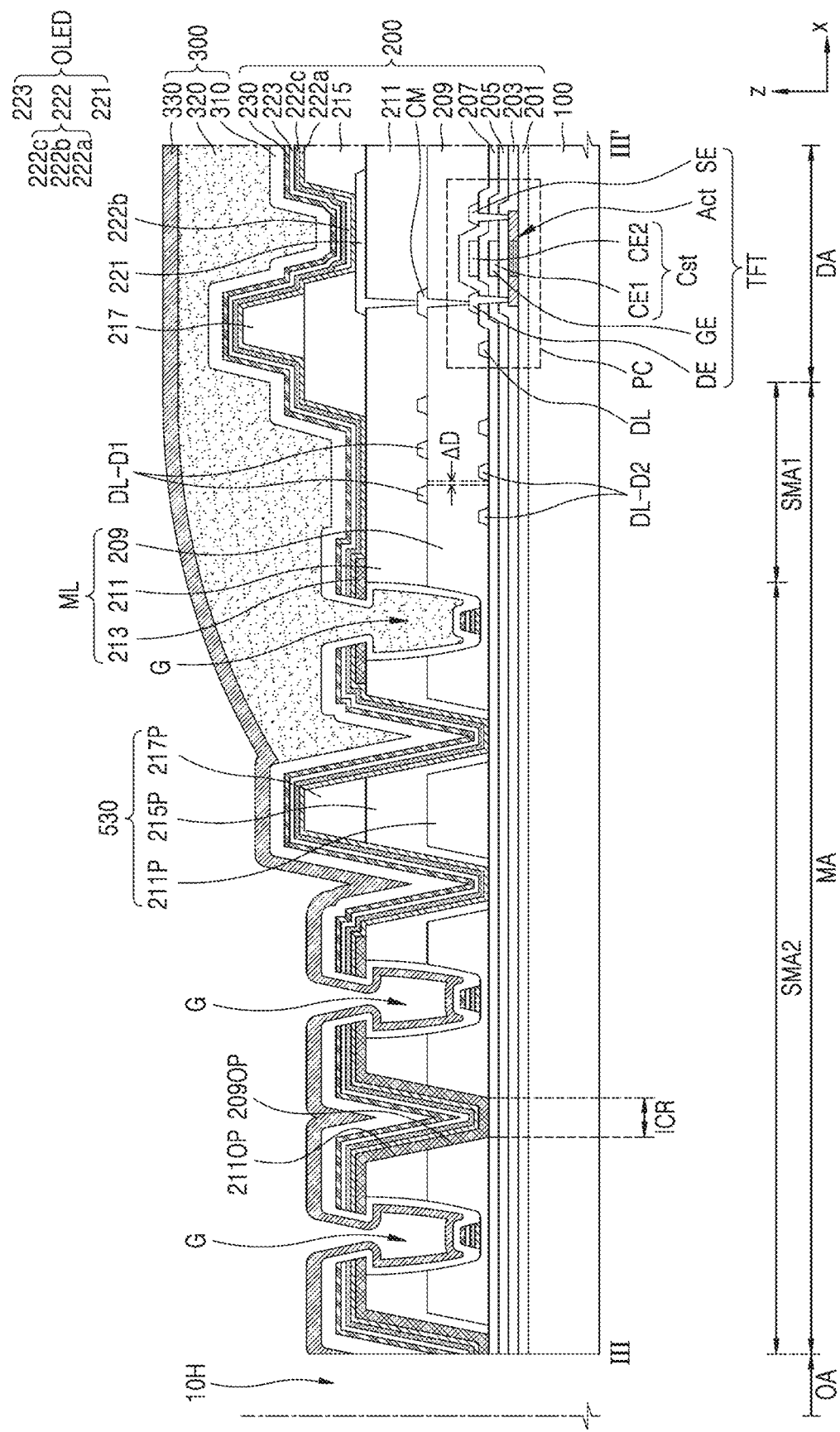
FIG. 16 is a cross-sectional view of a display panel according to another alternative embodiment.
Figure 17:
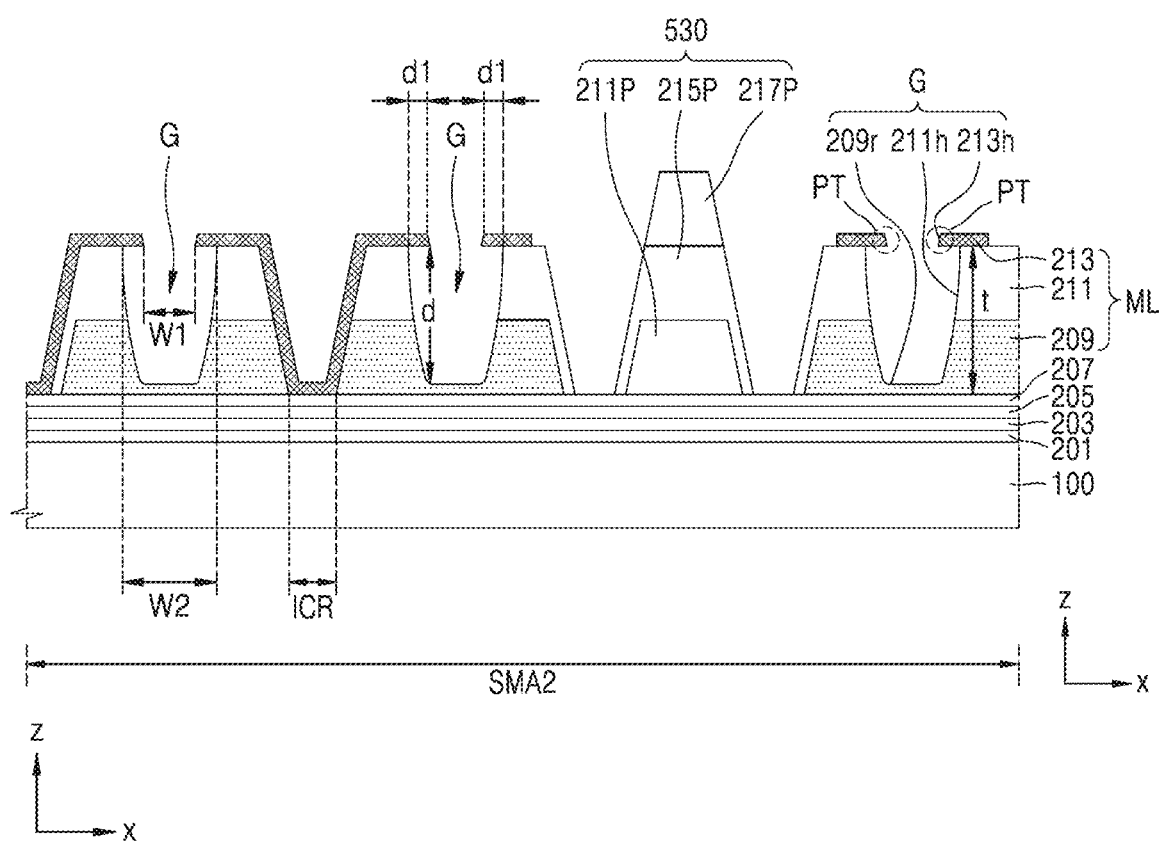
FIG. 17 is a cross-sectional view illustrating grooves in the display panel of FIG. 16.

FIG. 16 is a cross-sectional view of a display panel according to another alternative embodiment. FIG. 17 is a cross-sectional view illustrating grooves in the display panel of FIG. 16. The same or like elements shown in FIGS. 16 and 17 have been labeled with the same reference characters as used above to describe the embodiments of the display panel shown in FIG. 11, and any repetitive detailed description thereof will hereinafter be omitted or simplified.

In an embodiment of a display panel 10-4, as illustrated in FIG. 16, a contact metal layer CM may be arranged between a thin film transistor TFT and a pixel electrode 221. The contact metal layer CM may be connected to the thin film transistor TFT through a contact hole defined or formed in a first organic insulating layer 209, and the pixel electrode 221 may be connected to the contact metal layer CM through a contact hole defined or formed in a second organic insulating layer 211 on the contact metal layer CM. The contact metal layer CM may include at least one conductive material selected from molybdenum (Mo), aluminum (Al), copper (Cu), titanium (Ti) and the like and may have a single layer structure or a multi-layer structure, each layer including at least one selected from the above listed materials. In an embodiment, the contact metal layer CM may include three layers of Ti/Al/Ti.

The second organic insulating layer 211 may be disposed or formed on the first organic insulating layer 209 and may include an organic insulating material such as a general-purpose polymer such as PMMA or PS, a polymer derivative having a phenolic group, an acrylic polymer, an imide-based polymer, an arylether-based polymer, an amide-based polymer, a fluorine-based polymer, a p-xylene-based polymer, a vinyl alcohol-based polymer, or a combination (e.g., a blend) thereof. In one embodiment, for example, the second organic insulating layer 211 may include polyimide.

The signal lines located in the first sub intermediate region SMA1, for example, the data lines DL located in the intermediate area MA described with reference to FIG. 10, may include first data lines DL1 and second data lines DL2 alternately arranged above and below the first organic insulating layer 209 with the first organic insulating layer 209 therebetween. FIG. 15 illustrates an embodiment where the bypass portion DL-D1 of the first data line DL1 and the bypass portion DL-D2 of the second data line DL2 are arranged adjacent to each other and are respectively arranged above or below the first organic insulating layer 209. In such an embodiment, a gap (or pitch) ΔD between the adjacent first data line DL1 and second data line DL2, for example, between the bypass portion DL-D1 of the first data line DL1 and the bypass portion DL-D2 of the second data line DL2, may be reduced.

Grooves G may be located in the second sub intermediate area SMA2. The grooves G may be defined or formed in a multiple layer ML, and as illustrated in FIG. 16, the multiple layer ML may include a first organic insulating layer 209, a second organic insulating layer 211, and an inorganic layer 213. The first organic insulating layer 209 and the second organic insulating layer 211 may correspond to the first sub lower layer and the second sub lower layer of the multiple layer ML described with reference to FIG. 9D, and the inorganic layer 213 may correspond to the upper layer thereof.

The inorganic layer 213 may include a different material from the pixel electrode 221. The inorganic layer 213 may include a conductive oxide such as IZO, ITO, ZnO, $In_2O_3$, IGO, and/or AZO, may include a metal such as Mo, Cu, and/or Ti, or may include an insulating material such as silicon nitride, silicon oxide, and/or silicon oxynitride. In an embodiment, the inorganic layer 213 may be a portion of the mask layer 700 illustrated in FIG. 13B. In such an embodiment, as illustrated in FIG. 13E, the mask layer 700 is patterned by a photo process after the groove G is formed, the inorganic layer 213 may function as an upper layer of the groove G. The inorganic layer 213 may be provided in a same layer as the pixel electrode 221. In an embodiment, the inorganic layer 213 may be formed simultaneously with the pixel electrode 221 through a photo process on a layer forming the pixel electrode 221.

In an embodiment, as illustrated in FIG. 17, the groove G may include a hole 213h of the inorganic layer 213, a hole 211h of the second organic insulating layer 211, and a recess 209r of the first organic insulating layer 209. In such an embodiment, the bottom surface of the groove G may be between the top surface and the bottom surface of the first organic insulating layer 209. In an alternative embodiment, the first organic insulating layer 209 may include a hole defined through the first organic insulating layer 209, instead of the recess 209r, and in such an embodiment, the bottom surface of the groove G may be located in a same surface as the bottom surface of the first organic insulating layer 209 or the top surface of the second interlayer insulating layer 207.

The inorganic layer 213 may include tips PT extending toward the groove G, and the protrusion length d1 of the tip PT may be less than about 2 µm as described above. The depth d of the groove G may be about 2 µm or greater, about 2.5 µm or greater, about 3 µm or greater, or about 3.5 µm or greater.

A partition 530 may be located in the intermediate area MA. The partition 530 may be between adjacent grooves G. The partition 530 may be formed by sequentially stacking a portion 211P of a layer forming the second organic insulating layer 211, a portion 215P of a layer forming the pixel definition layer 215, and a portion 217P of a layer forming the spacer 217. The height from the top surface of the substrate 100 to the top surface of the partition 530 may be lower than the height from the top surface of the substrate 100 to the top surface of the spacer 217.

The intermediate area MA may include an inorganic contact region ICR. The inorganic contact region ICR may be between adjacent grooves G. The inorganic contact region ICR may be a direct contact region of layers including an inorganic material, and FIG. 16 illustrates an embodiment where the inorganic layer 213 directly contacts the second interlayer insulating layer 207. The inorganic layer 213 may contact the second interlayer insulating layer 207 through openings 209OP and 211OP respectively defined or formed in the first organic insulating layer 209 and the second organic insulating layer 211.

The grooves G may be formed before a process of forming the intermediate layer 222, and the first functional layer 222a, the second functional layer 222c, the opposite electrode 223 and the capping layer 230 may be disconnected or separated by the grooves G as illustrated in FIG. 16.

The first inorganic encapsulation layer 310 may continuously extend to cover the top, side, and bottom surfaces of the inorganic layer 213 and cover the side surface of the second organic insulating layer 211 and the side surface of the first organic insulating layer 209.

The organic encapsulation layer 320 may cover a portion of the display area DA and the intermediate area MA. An end portion of the organic encapsulation layer 320 adjacent to the first area OA may be arranged adjacent to one side of the partition 530.

The second inorganic encapsulation layer 330 may be located on the organic encapsulation layer 320 and may directly contact the first inorganic encapsulation layer 310 in the intermediate area MA. In one embodiment, for example, in an area between the first area OA and the partition 530, the first inorganic encapsulation layer 310 and the second inorganic encapsulation layer 330 may contact each other.

Because the second inorganic encapsulation layer 330 has a high step coverage like the first inorganic encapsulation layer 310, the second inorganic encapsulation layer 330 may continuously cover the inner side surfaces of the grooves G located between the first area OA and the partition 530.

Figure 18:
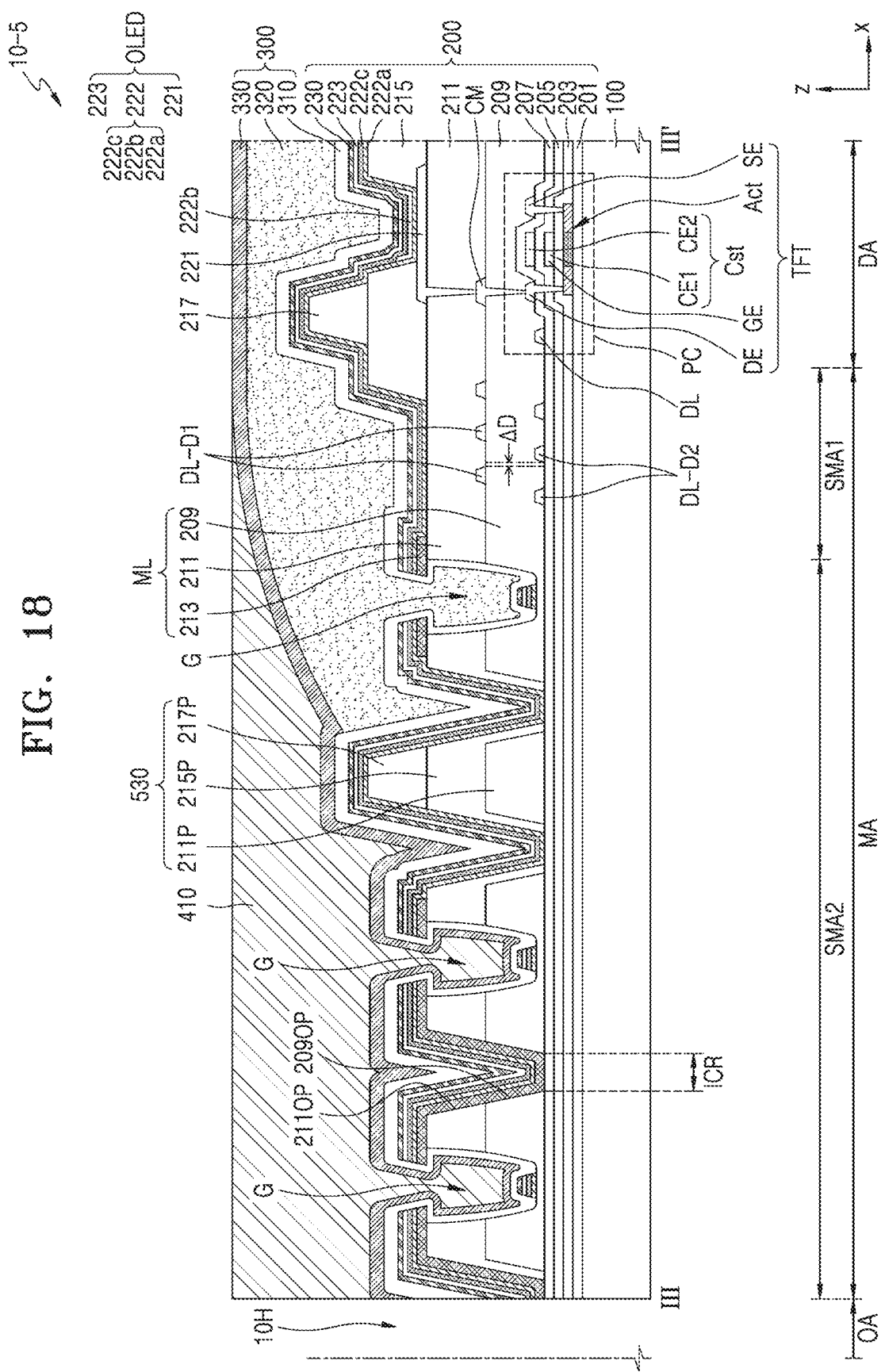
FIG. 18 is a cross-sectional view of a display panel according to another alternative embodiment.

FIG. 18 is a cross-sectional view of a display panel according to another alternative embodiment.

A display panel 10-5 illustrated in FIG. 18 is substantially the same as the display panel 10-4 described with reference to FIG. 16 except that the display panel 10-5 further includes a planarization layer 410.

In embodiments of the invention, as described herein, the display apparatuses may prevent the display elements from being damaged by external impurities such as moisture infiltrated through the transmission area. However, these effects are merely exemplary and the effects according to embodiments are not limited thereto.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A method of manufacturing a display device, the method comprising:
preparing a substrate including a transmission area, a display area surrounding the transmission area, and a non-display area between the transmission area and the display area;
providing a plurality of insulating layers on the substrate and forming an opening through some of the plurality of insulating layers to correspond to the non-display area;
providing a pixel electrode on the plurality of insulating layers corresponding to the display area;
providing a protection layer covering the pixel electrode;
providing a mask layer covering the protection layer and a side surface and a bottom surface of the opening;
removing a portion of the mask layer located on the bottom surface of the opening;
forming a groove by removing a lower layer of the opening after the removing the portion of the mask layer on the bottom surface thereof;
removing the mask layer;
removing the protection layer; and
providing an intermediate layer on the pixel electrode,
wherein the intermediate layer includes an organic material layer, and
the organic material layer extends to the non-display area and is disconnected by the groove.

2. The method of claim 1, wherein the protection layer covers at least an area of the pixel electrode where an emission layer is arranged.

3. The method of claim 1, wherein the protection layer includes an organic material.

4. The method of claim 1, wherein the protection layer includes a photoresist.

5. The method of claim 1, wherein the protection layer includes an organic ink.

6. The method of claim 1, wherein the protection layer is removed by a strip process.

7. The method of claim 1, wherein the mask layer includes a conductive oxide.

8. The method of claim 1, wherein the portion of the mask layer located on the bottom surface of the opening is removed by a wet etching process.

9. The method of claim 1, wherein the mask layer is removed by a wet etching process.

10. The method of claim 1, wherein the lower layer of the opening is removed by a dry etching process.

11. The method of claim 1, wherein the substrate includes:
a first base layer;
a first barrier layer on the first base layer;
a second base layer on the first barrier layer; and
a second barrier layer on the second base layer.

12. The method of claim 11, wherein the lower layer of the opening includes the second base layer and the second barrier layer.

13. The method of claim 1, wherein the lower layer of the opening includes:
- an inorganic layer; and
- an organic layer located under the inorganic layer.

14. A display device comprising:
- a substrate including a transmission area, a display area surrounding the transmission area, and a non-display area between the transmission area and the display area;
- a plurality of insulating layers disposed on the substrate;
- a display element disposed on the plurality of insulating layers to correspond to the display area, wherein the display element includes a pixel electrode, an opposite electrode, and an intermediate layer between the pixel electrode and the opposite electrode;
- a pixel definition layer covering an edge of the pixel electrode, wherein an opening is defined through the pixel definition layer to correspond to a portion of the pixel electrode;
- wherein a groove is defined in the non-display area; and
- an organic material disposed at an inner surface of the opening of the pixel definition layer,
- wherein the organic material includes a photoresist,
- wherein the intermediate layer includes an organic material layer, and the organic material layer extends to the non-display area and is disconnected by the groove,
- the groove is defined in a multiple layer including a lower layer and an upper layer, and at least one selected from the lower layer and the upper layer is defined by at least one of layers constituting the substrate, and
- the groove is aligned to correspond with another opening defined through the pixel definition layer.

15. The display device of claim 14, wherein the substrate includes:
- a first base layer;
- a first barrier layer on the first base layer;
- a second base layer on the first barrier layer; and
- a second barrier layer on the second base layer.

16. The display device of claim 15, wherein
the upper layer of the multiple layer includes the second barrier layer, and
the lower layer of the multiple layer includes the second base layer.

17. The display device of claim 15, wherein
the second barrier layer includes an inorganic material, and
the second base layer includes an organic material.

18. The display device of claim 14, wherein
the upper layer of the multiple layer includes an inorganic layer, and
the lower layer of the multiple layer includes an organic layer located under the inorganic layer.

19. The display device of claim 14, further comprising:
a thin film encapsulation layer disposed on the display element, wherein the thin film encapsulation layer includes an inorganic encapsulation layer and an organic encapsulation layer,
wherein the inorganic encapsulation layer continuously covers an inner surface of the groove.

* * * * *